United States Patent
Chari et al.

(10) Patent No.: US 7,146,447 B2
(45) Date of Patent: *Dec. 5, 2006

(54) SYSTEM FOR FACILITATING THE REPLACEMENT OR INSERTION OF DEVICES IN A COMPUTER SYSTEM THROUGH THE USE OF A GRAPHICAL USER INTERFACE

(75) Inventors: Srikumar N. Chari, Cupertino, CA (US); Kenny L. Bright, Hayward, CA (US)

(73) Assignee: Micron Technology, Inc., Boise, ID (US)

( * ) Notice: Subject to any disclaimer, the term of this patent is extended or adjusted under 35 U.S.C. 154(b) by 124 days.

This patent is subject to a terminal disclaimer.

(21) Appl. No.: 10/786,620

(22) Filed: Feb. 24, 2004

(65) Prior Publication Data

US 2004/0199696 A1    Oct. 7, 2004

Related U.S. Application Data

(63) Continuation of application No. 09/552,032, filed on Apr. 19, 2000, now Pat. No. 6,711,645, which is a continuation of application No. 08/942,317, filed on Oct. 1, 1997, now Pat. No. 6,134,615.

(60) Provisional application No. 60/046,310, filed on May 13, 1997.

(51) Int. Cl.
  *G06F 13/00*   (2006.01)

(52) U.S. Cl. .................................... 710/302

(58) Field of Classification Search ......... 710/301–304
  See application file for complete search history.

(56) References Cited

U.S. PATENT DOCUMENTS 4,999,787 A    3/1991   McNally et al. ............ 364/514

(Continued)

FOREIGN PATENT DOCUMENTS

EP    0 520 770 A2    12/1992

(Continued)

OTHER PUBLICATIONS

Cowart, Mastering Windows 3.1 Special Edition, Sybex, Inc., pp. 119 & 814, Copyright 1993.

(Continued)

*Primary Examiner*—Paul R. Myers
(74) *Attorney, Agent, or Firm*—Knobbe, Martens, Olson & Bear, LLP

(57) ABSTRACT

A computer software system is disclosed for facilitating a user's replacement or insertion of devices in a computer server network system. The system allows a user to swap or add peripheral devices while the system is running, or in a "hot" condition, with little or no user knowledge of how the system carries out the "hot swap" or "hot add" functions. The system, which consists of a graphical user interface (GUI) and associated computer software modules, allows the user to select a desired peripheral device location within a server, and then provides the modular software structure to automatically execute a series of steps in the hot swap or hot add process. Each step is prompted by the user from the GUI, to invoke commands to instruct a network server through its operating system and hardware to suspend the appropriate device adapters, if necessary, power down the desired device slot or canister, allow the user to replace or insert a new device, and finally restart the adapters and the slot power. The system requires very little detailed input from the user other than identifying the particular peripheral device slot within the server to be maintained.

39 Claims, 32 Drawing Sheets

U.S. PATENT DOCUMENTS

| | | | |
|---|---|---|---|
| 5,123,017 A | 6/1992 | Simpkins et al. | 371/15.1 |
| 5,210,855 A | 5/1993 | Bartol | 395/500 |
| 5,261,044 A | 11/1993 | Dev et al. | 395/159 |
| 5,272,584 A | 12/1993 | Austruy et al. | 361/58 |
| 5,274,680 A | 12/1993 | Sorton et al. | 375/118 |
| 5,337,413 A | 8/1994 | Lui et al. | 395/275 |
| 5,340,340 A | 8/1994 | Hastings et al. | 439/64 |
| 5,379,409 A | 1/1995 | Ishikawa | 395/575 |
| 5,386,567 A | 1/1995 | Lien et al. | 395/700 |
| 5,463,742 A | 10/1995 | Kobayashi | 710/303 |
| 5,487,148 A | 1/1996 | Komori et al. | 395/182.02 |
| 5,491,796 A | 2/1996 | Wanderer et al. | 395/200.09 |
| 5,517,646 A | 5/1996 | Piccirillo et al. | 395/700 |
| 5,546,595 A | 8/1996 | Norman et al. | 395/800 |
| 5,555,510 A | 9/1996 | Verseput et al. | 364/514 R |
| 5,560,022 A | 9/1996 | Dunstan et al. | 713/300 |
| 5,561,769 A | 10/1996 | Kumar et al. | 395/200.05 |
| 5,564,024 A | 10/1996 | Pemberton | 395/283 |
| 5,576,946 A | 11/1996 | Bender et al. | 364/146 |
| 5,579,487 A | 11/1996 | Meyerson et al. | 710/100 |
| 5,579,491 A * | 11/1996 | Jeffries et al. | 710/302 |
| 5,581,712 A | 12/1996 | Herrman | 395/283 |
| 5,604,873 A | 2/1997 | Fite et al. | 395/283 |
| 5,644,731 A | 7/1997 | Liencres et al. | 395/283 |
| 5,651,006 A | 7/1997 | Fujino et al. | 370/408 |
| 5,652,892 A | 7/1997 | Ugajin | 395/750 |
| 5,655,081 A | 8/1997 | Bonnell et al. | 395/200.32 |
| 5,666,362 A | 9/1997 | Chen et al. | 370/420 |
| 5,671,441 A | 9/1997 | Glassen et al. | 395/828 |
| 5,678,006 A | 10/1997 | Valizadeh et al. | 395/200.02 |
| 5,678,042 A | 10/1997 | Pisello et al. | 395/610 |
| 5,684,945 A | 11/1997 | Chen et al. | 395/182.18 |
| 5,689,637 A | 11/1997 | Johnson et al. | 395/182.22 |
| 5,691,926 A | 11/1997 | Cannon et al. | 702/122 |
| 5,696,486 A | 12/1997 | Poliquin et al. | 340/506 |
| 5,696,970 A | 12/1997 | Sandage et al. | 709/324 |
| 5,710,908 A | 1/1998 | Man | 395/500 |
| 5,732,212 A | 3/1998 | Perholtz et al. | 709/224 |
| 5,745,897 A | 4/1998 | Perkins et al. | 707/101 |
| 5,748,098 A | 5/1998 | Grace | 340/825.16 |
| 5,751,575 A | 5/1998 | Hirosawa et al. | 364/188 |
| 5,751,933 A | 5/1998 | Dev et al. | 395/182.02 |
| 5,754,426 A | 5/1998 | Dumais | 364/188 |
| 5,758,101 A * | 5/1998 | Pemberton | 710/302 |
| 5,758,103 A | 5/1998 | Oh | 395/283 |
| 5,761,085 A | 6/1998 | Giorgio | 364/505 |
| 5,761,429 A | 6/1998 | Thompson | 395/200.54 |
| 5,764,911 A | 6/1998 | Tezuka et al. | 395/200.53 |
| 5,764,913 A | 6/1998 | Jancke et al. | 395/200.54 |
| 5,768,541 A | 6/1998 | Pan-Ratzlaff | 395/283 |
| 5,774,667 A | 6/1998 | Garvey et al. | 395/200.52 |
| 5,781,798 A | 7/1998 | Beatty et al. | 395/830 |
| 5,784,576 A | 7/1998 | Guthrie et al. | 395/283 |
| 5,787,246 A | 7/1998 | Lichtman et al. | 395/200.5 |
| 5,796,633 A | 8/1998 | Burgess et al. | 364/551.01 |
| 5,799,016 A | 8/1998 | Onweller | 370/401 |
| 5,802,146 A | 9/1998 | Dulman | 379/34 |
| 5,812,750 A | 9/1998 | Dev et al. | 395/182.02 |
| 5,815,647 A | 9/1998 | Buckland et al. | 714/3 |
| 5,815,652 A | 9/1998 | Ote et al. | 395/183.07 |
| 5,819,042 A * | 10/1998 | Hansen | 709/222 |
| 5,826,046 A | 10/1998 | Nguyen et al. | 395/309 |
| 5,838,319 A | 11/1998 | Guzak et al. | 345/340 |
| 5,854,904 A * | 12/1998 | Brown | 710/100 |
| 5,862,333 A | 1/1999 | Graf | 395/200.53 |
| 5,892,912 A | 4/1999 | Suzuki et al. | 395/200.48 |
| 5,901,304 A | 5/1999 | Hwang et al. | 395/500 |
| 5,907,610 A | 5/1999 | Onweller | 379/242 |
| 5,910,954 A | 6/1999 | Bronstein et al. | 370/401 |
| 5,913,037 A | 6/1999 | Spofford et al. | 395/200.56 |
| 5,918,004 A | 6/1999 | Anderson et al. | 395/183.14 |
| 5,922,051 A | 7/1999 | Sidey | 709/223 |
| 5,925,117 A | 7/1999 | Kirby et al. | 710/303 |
| 5,943,482 A | 8/1999 | Culley et al. | 710/302 |
| 5,944,782 A | 8/1999 | Noble et al. | 709/202 |
| 5,961,596 A | 10/1999 | Takubo et al. | 709/224 |
| 6,000,045 A | 12/1999 | Lewis | 714/47 |
| 6,023,507 A | 2/2000 | Wookey | 380/21 |
| 6,038,680 A * | 3/2000 | Olarig | 714/6 |
| 6,070,207 A | 5/2000 | Bell | 710/302 |
| 6,125,390 A | 9/2000 | Touboul | 709/223 |
| 6,141,711 A | 10/2000 | Shah et al. | 710/302 |
| 6,275,864 B1 * | 8/2001 | Mancusi et al. | 709/250 |

FOREIGN PATENT DOCUMENTS

| | | |
|---|---|---|
| WO | WO 95/09387 | 4/1995 |
| WO | WO 96/24899 | 8/1996 |

OTHER PUBLICATIONS

Gavron & Moran, How to Use Microsoft Windows NT 4 Workstation, Ziff-Davis Press, pp. 27, 35, 38-39, 41, 49, & 155, Copyright 1996.

IBM Technical Disclosure Bulletin, 35(2): 69-74, Jul. 1992, "Serial Channel Synchronizer".

IBM Technical Disclosure Bulletin, 39(7): 229-230, Jul. 1996, "Client Object Model for Distributed Servers.".

NetFRAME Syetems Incorporated, datasheet, Feb. 1996, "NF450FT Network Mainframe.".

NetFRAME Systems Incorporated, datasheet, Mar. 1996, "NetFRAME Cluster Server 8000.".

NetFRAME Systems Incorporated, News Release, 3 pages, referring to May 9, 1994, "NetFRAME'New High-Availability ClusterServer Systems Avoid Scheduled as well as Unscheduled Downtime.".

PCI Special Interest Group, specification, 35 pages, Draft For Review Only, Jun. 15, 1997, "PCI Bus Hot Plug Specification.".

Sanchez et al., Abstract CAMAD '94, IEEE Workshop on Computer Aided Design and Modeling. p. 34, 1994, "DISNES: A Distributed Network Emulation System for Gigabit Networks.".

Schofield, M.J., http://www.omegas.co.uk/CAN/canworks.htm, Copyright 1996, 1997, "Controller Area Network—How CAN Works.".

Standard Overview, htt://www.pc-card.com/stand_overview.html#1, 9 pages, Jun. 1990, "Detailed Overview of the PC Card Standard.".

Truong et al., IEEE Communications Magazine, pp. 70-85, May 1995, "LAN Emulation on an ATM Network.".

* cited by examiner

SYSTEM FOR FACILITATING THE REPLACEMENT OR INSERTION OF DEVICES IN A COMPUTER SYSTEM THROUGH THE USE OF A GRAPHICAL USER INTERFACE

RELATED APPLICATION

This application is a continuation of U.S. patent application Ser. No. 09/552,032, filed Apr. 19, 2000, now U.S. Pat. No. 6,711,645, issued Mar. 23, 2004, which is a continuation of U.S. patent application Ser. No. 08/942,317, filed Oct. 1, 1997, now, U.S. Pat. No. 6,134,615, issued Oct. 17, 2000, which claims the benefit under 35 U.S.C. §119(e) of U.S. Provisional Application No. 60/046,310, filed May 13, 1997 and entitled "High Performance Network Server System Management Interface."

PRIORITY CLAIM

The benefit under 35 U.S.C. § 119(e) of U.S. Provisional Application No. 60/046,310, filed May 13, 1997 and entitled "High Performance Network Server System Management Interface," is hereby claimed.

APPENDIX A

Appendix A, which forms a part of this disclosure, is a list of commonly owned copending U.S. patent applications. Each one of the applications listed in Appendix A is hereby incorporated herein in its entirety by reference thereto.

COPYRIGHT RIGHTS

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

1. Field of the Invention

The present invention relates to user interfaces for computer systems. More particularly, the present invention relates to implementing a graphical user interface (GUI) to allow for easy and efficient management and maintenance of peripheral devices in a computer network.

2. Description of the Related Technology

As enterprise-class servers, which are central computers in a network that manage common data, become more powerful and more capable, they are also becoming ever more sophisticated and complex. For many companies, these changes lead to concerns over server reliability and manageability, particularly in light of the increasingly critical role of server-based applications. While in the past many systems administrators were comfortable with all of the various components that made up a standards-based network server, today's generation of servers can appear as an incomprehensible, unmanageable black box. Without visibility into the underlying behavior of the system, the administrator must "fly blind." Too often, the only indicators the network manager has on the relative health of a particular server is whether or not it is running.

It is well-acknowledged that there is a lack of reliability and availability of most standards-based servers. Server downtime, resulting either from hardware or software faults or from regular maintenance, continues to be a significant problem with significant costs. With emerging Internet, intranet and collaborative applications taking on more essential business roles every day, the cost of network server downtime will continue to spiral upward.

While hardware fault tolerance is an important element of an overall high availability architecture, it is only one piece of the puzzle. Studies show that a significant percentage of network server downtime is caused by transient faults in the I/O subsystem. These faults may be due, for example, to the device driver, the device firmware or hardware, which does not properly handle concurrent errors, and often causes servers to crash or hang. The result is hours of downtime per failure while a system administrator discovers the failure, takes some action and manually reboots the server. In many cases, data volumes on hard disk drives become corrupt and must be repaired when the volume is mounted. A dismount-and-mount cycle may result from the lack of "hot pluggability" or "hot plug" in current standards-based servers. Hot plug refers to the addition and swapping of peripheral adapters to an operational computer system. An adapter is simply any peripheral printed circuit board containing microchips, such as a PCI card, that may be removed from or added to a server peripheral device slot. Diagnosing intermittent errors can be a frustrating and time-consuming process. For a system to deliver consistently high availability, it should be resilient to these types of faults.

Existing systems also do not have an interface to control the changing or addition of an adapter. Since any user on a network could be using a particular adapter on the server, system administrators need a software application that controls the flow of communications to an adapter before, during, and after a hot plug operation on an adapter.

Current operating systems do not by themselves provide the support users need to hot add and swap an adapter. System users need software that will freeze and resume the communications of their adapters in a controlled fashion. The software needs to support the hot add of various peripheral adapters such as mass storage and network adapters. Additionally, the software should support adapters that are designed for various bus systems such as Peripheral Component Interconnect, CardBus, Microchannel, Industrial Standard Architecture (ISA), and Extended ISA (EISA). System users also need software to support the hot add and swap of adapters within canisters, which are detachable bus casings for a detachable bus system, and which also provide multiple slots for adapters.

In a typical PC-based server, upon the failure of an adapter, the system must be powered down, the new adapter and adapter driver installed, the server powered back up and the operating system reconfigured. However, various entities have tried to implement the hot plug of these adapters to a fault tolerant computer system. One significant difficulty in designing a hot plug system is protecting the circuitry contained on the adapter from being short-circuited when an adapter is added to a powered system. Typically, an adapter contains edge connectors which are located on one side of the printed circuit board. These edge connectors allow power to transfer from the system bus to the adapter, as well as supplying data paths between the bus and the adapter. These edge connectors fit into a slot on the bus on the computer system. A traditional hardware solution for "hot plug" systems includes increasing the length of at least one ground contact of the adapter, so that the ground contact on the edge connector is the first connector to contact the bus on insertion of the I/O adapter and the last connector to contact the bus on removal of the adapter.

An example of such a solution is described in U.S. Pat. No. 5,210,855 to Bartol.

U.S. Pat. No. 5,579,491 to Jeffries discloses an alternative solution to the hot installation of I/O adapters. Here, each hotly installable adapter is configured with a user actuable initiator to request the hot removal of an adapter. The I/O adapter is first physically connected to a bus on the computer system. Subsequent to such connection, a user toggles a switch on the I/O adapter which sends a signal to the bus controller. The signal indicates to the bus controller that the user has added an I/O adapter. The bus controller then alerts the user through a light emitting diode (LED) whether the adapter can be installed on the bus.

However, the invention disclosed in the Jeffries patent also contains several limitations. It requires the physical modification of the adapter to be hotly installed. Another limitation is that the Jeffries patent does not teach the hot addition of new adapter controllers or bus systems. Moreover, the Jeffries patent requires that before an I/O adapter is removed, another I/O adapter must either be free and spare or free and redundant. Therefore, if there was no free adapter, hot removal of an adapter is impossible until the user added another adapter to the computer system.

A related technology, not to be confused with hot plug systems, is Plug and Play defined by Microsoft® Corporation and PC product vendors. Plug and Play is an architecture that facilitates the integration of PC hardware adapters into systems. Plug and Play adapters are able to identify themselves to the computer system after the user installs the adapter on the bus. Plug and Play adapters are also able to identify the hardware resources that are needed for operation. Once this information is supplied to the operating system, the operating system can load the adapter drivers for the adapter that the user had added while the system was in a non-powered state. However, to date, Plug and Play has only been utilized for the hot docking of a portable computer to an expansion base.

Therefore, a need exists for improvements in server management which can result in continuous operation despite adapter failures. System users should be able to replace failed components, upgrade outdated components, and add new functionality, such as new network interfaces, disk interface adapters and storage, without impacting existing users. Additionally, system users need a process to hot add their legacy adapters, without purchasing new adapters that are specifically designed for hot plug. As system demands grow, organizations must frequently expand, or scale, their computing infrastructure, adding new processing power, memory, mass storage and network adapters. With demand for 24-hour access to critical, server-based information resources, planned system downtime for system service or expansion has become unacceptable.

The improvements of co-ending applications entitled "Hot Add of Devices Software Architecture" (U.S. Pat. No. 6,499,073, issued Dec. 24, 2002) and "Hot Swap of Devices Software Architecture," (U.S. Pat. No. 6,304,929, issued Oct. 16, 2001), as well as their related applications, all filed on Oct. 1, 1997, adds hot swap and hot add capabilities to server network. The recent availability of hot swap and hot add capabilities requires that a user maintaining the server, usually a server network system administrator, knows or learns the numerous and complicated steps required to swap or add a peripheral device, including how to suspend the device adapters, how to power down and up the correct server slot and/or canister, etc. These steps are more fully disclosed in the co-ending applications referenced above and incorporated herein by reference. In addition, because servers have become very reliable, the system administrator will often be caught in a position of not knowing or having forgotten how to swap or add a peripheral adapter when a server malfunctions or when a new adapter needs to be added. Today's servers do not often malfunction, and the system administrator may add adapters only a few times a year.

Without detailed knowledge of the hot swap and hot add processes, the system administrator will be unable to change out and install peripheral devices. In that case, the entire server system must then be shut down, the peripheral adapter replaced or inserted, and the system restarted. This can result in severe losses to the system users in terms of network downtime and inability to service clients. In addition, it results in a failure to take advantage of the currently available hot swap and hot add technology. However, without an automated step-by-step process from the user's point of view, these results are inevitable.

Therefore, a need exists to automate, as much as possible, the hot swap and hot add processes, so that the benefits of those capabilities in a server are not compromised by insufficient technical knowledge of those processes on the part of the network administrator. Because implementation of the hot add and hot swap processes only depends on (1) which process is necessary (i.e. hot swap or hot add) and (2) which particular server peripheral device slot is concerned, the user should be able to perform these processes knowing such information. The remaining steps in the hot swap and hot add processes may be completely automated. This can allow the necessary hot swapping and hot addition of adapters to be performed quickly and efficiently, by non-expert personnel, while the server is running. In the usual case, it would allow the system administrator to perform a hot swap or a hot add with little or no learning curve.

SUMMARY OF THE INVENTION

The present invention provides a user of a typical client-server or similar system, usually a system administrator, with a simple, understandable user interface that allows the user to both view and transmit basic instructions to perform the steps in a hot plug or similar process in the system. In one embodiment of the invention, the system comprises a computer that includes memory, a module that operates to provide a user interface, and a module that transmits communications and instructions between that user interface and the computer to execute a hot plug process. The user interface may be a graphical user interface, and may comprise a series of screen displays capable of showing and executing the steps of a hot plug process for a peripheral adapter. The hot plug process may be a hot swap process, a hot add process, or other similar process.

DETAILED DESCRIPTION OF THE INVENTION

The various features of the invention will be described with reference to a particular software module (referred to as the "Hot Plug PCI Wizard") and various related components. The Hot Plug PCI Wizard is part of the Maestro Central ("Maestro") computer program, sold by NetFRAME Systems, Inc. In these drawings, reference numbers are reused, where appropriate, to indicate a correspondence between referenced items. Moreover, although the following detailed description describes particular embodiments of the invention, the invention can be embodied in a multitude of different ways as defined and covered by the claims. Finally, the following detailed description describes embodiments of the invention under the Windows® NT and the NetWare® operating systems. Alternative embodiments of the invention may use other commercial operating systems, such as MacIntosh® OS, OS/2, VMS, DOS, Windows® 3.1/95/98 or UNIX.

In addition, in the following description of the invention, a "module" includes, but is not limited to, software or hardware components which perform certain tasks. Thus, a module may include object-oriented software components, class components, procedures, subroutines, data structures, segments of program code, drivers, firmware, microcode, circuitry, data, tables, arrays, etc. A module also includes all components within the definition of "module" found in RFC 1213, *Management Information Base for Network Management of TCP/IP-based Internets: MIB-II*, which contains a module defining the basic objects needed to manage a TCP/IP network. Separate RFC documents contain modules defining objects for specific technologies such as Token-Ring interfaces, Open Shortest Path First (OSPF) routing, and Appletalk® networking. Those with ordinary skill in the art will also recognize that a module can be implemented using a wide variety of different software and hardware techniques.

Figure 1:
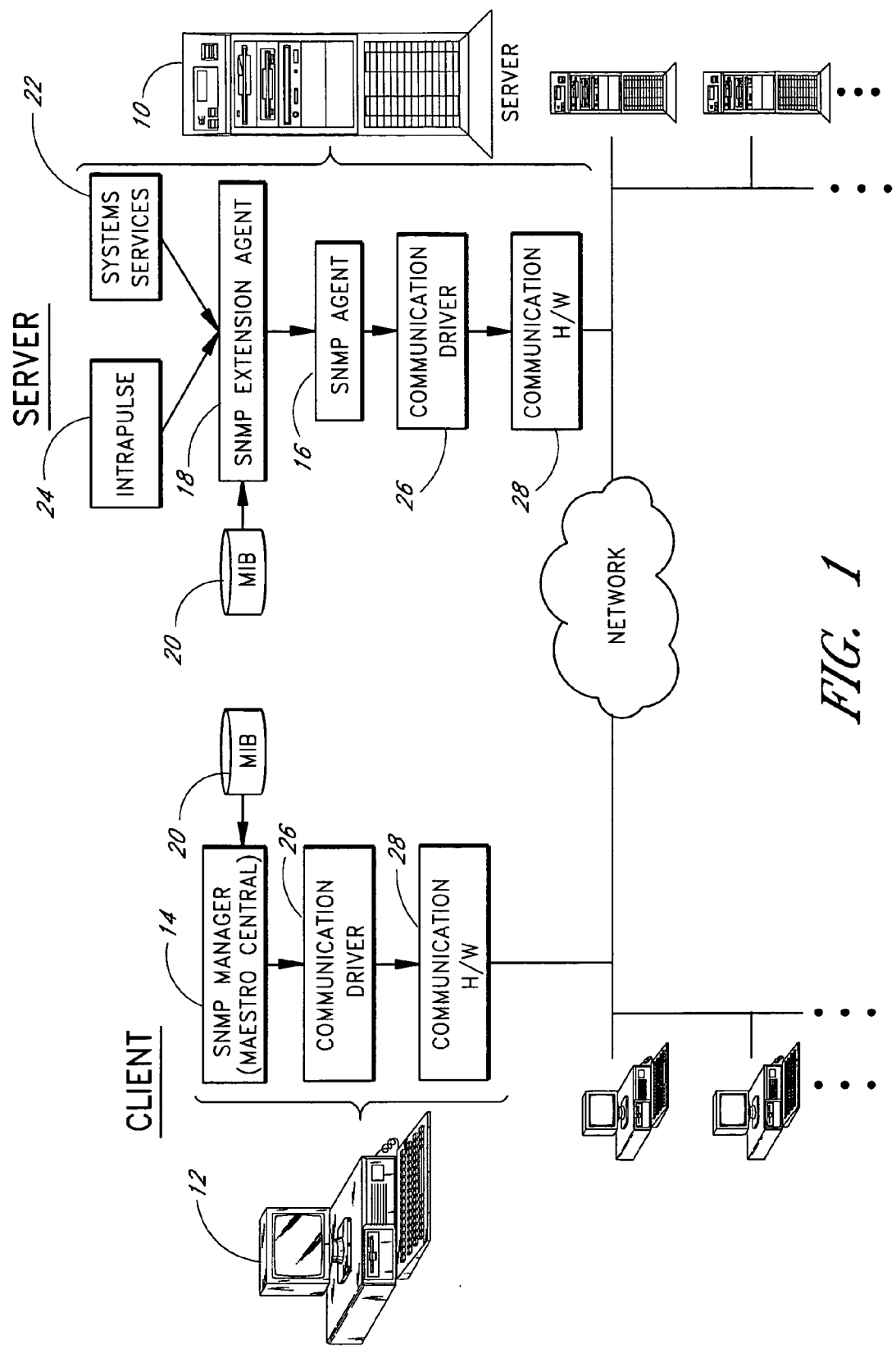
FIG. 1 is a block diagram showing a fault-tolerant computer system which uses one embodiment of the present invention.

FIG. 1 presents an overview of a computer system in which the invention may be used. One or more servers 10 are used to support one or more clients 12 in a typical client-server network, which is made up of various hardware components, including standard microprocessors. The microprocessors used may be any conventional general purpose single- or multi-chip microprocessor such as a Pentium® processor, a Pentium® Pro processor, a 8051 processor, a MIPS® processor, a Power PC® processor, or an ALPHA® processor. In addition, the microprocessor(s) may be any conventional special purpose microprocessor such as a digital signal processor or a graphics processor. The microprocessor(s) will have conventional address lines, conventional data lines, and one or more conventional control lines.

A user at one of the client 12 monitoring stations uses the Simple Network Management Protocol (SNMP) Manager (Maestro) 14 to obtain information regarding the status of various machines and/or devices in the server, and to send instructions to the server through an SNMP Agent 16 and various other system components as shown. The SNMP serves as a mechanism to provide and transport management information between network components, in order to manage the actual devices in a network. The SNMP was developed almost ten years ago as a standard for internetwork management. It has been widely published and is widely available today.

Maestro 14 at the client uses the SNMP to transmit instructions to the SNMP Agent 16 and SNMP Extension Agent 18, and vice versa. The SNMP permits interactive network administration via parameter checks and supervision of certain network conditions. SNMP uses a transport protocol stack such as the User Datagram Protocol/Internet Protocol (UDP/IP), Transmission Control Protocol/Internet Protocol (TCP/IP), DECnet (Digital Equipment Corporation network protocol), and others.

Maestro 14 provides the user, including network administrators, with a representation of the state of the target machine and/or devices in the server. It can provide this representation in simple (character-oriented) or graphical form. Maestro 14 herein described is graphical and has been specifically designed for the NF-9000 servers' Management Information Base, or MIB. A MIB is simply a virtual information database containing information necessary to manage devices in the network. The module types that represent management information transferred via the SNMP protocol through the network are gathered in the MIB 20. Thus, the MIB 20 contains variables that hold status information regarding the server(s) and other devices in the network. Maestro 14 accesses the data in the MIB to send proper instructions to and from the user over the network, using the SNMP. The devices mentioned in the discussion herein include peripheral cards or adapters that may be plugged into receiving slots in the server. The present invention also applies to any device that may be inserted into or removed from a server-that is, "hot pluggable" devices.

The SNMP instructions sent by Maestro 14 reach the SNMP Agent 16 and/or the SNMP Extension Agent 18 at the server end via the network drivers 26, communication hardware 28, and network medium. The SNMP Agent 16 and SNMP Extension Agent 18 wait for incoming requests and respond to them using information retrieved from the system services 22 such as device drivers, the Intrapulse 24 firmware, and other components of the operating system. These functions and the software and hardware involved are further described in the co-pending applications entitled "Hot Add of Devices Software Architecture" (U.S. Pat. No. 6,499,073, issued Dec. 24, 2002) and "Hot Swap of Devices Software Architecture," U.S. Pat. No. 6,304,929, issued Oct. 16, 2001), and their related applications, filed Oct. 1, 1997 and herein incorporated by reference.

Figure 2:
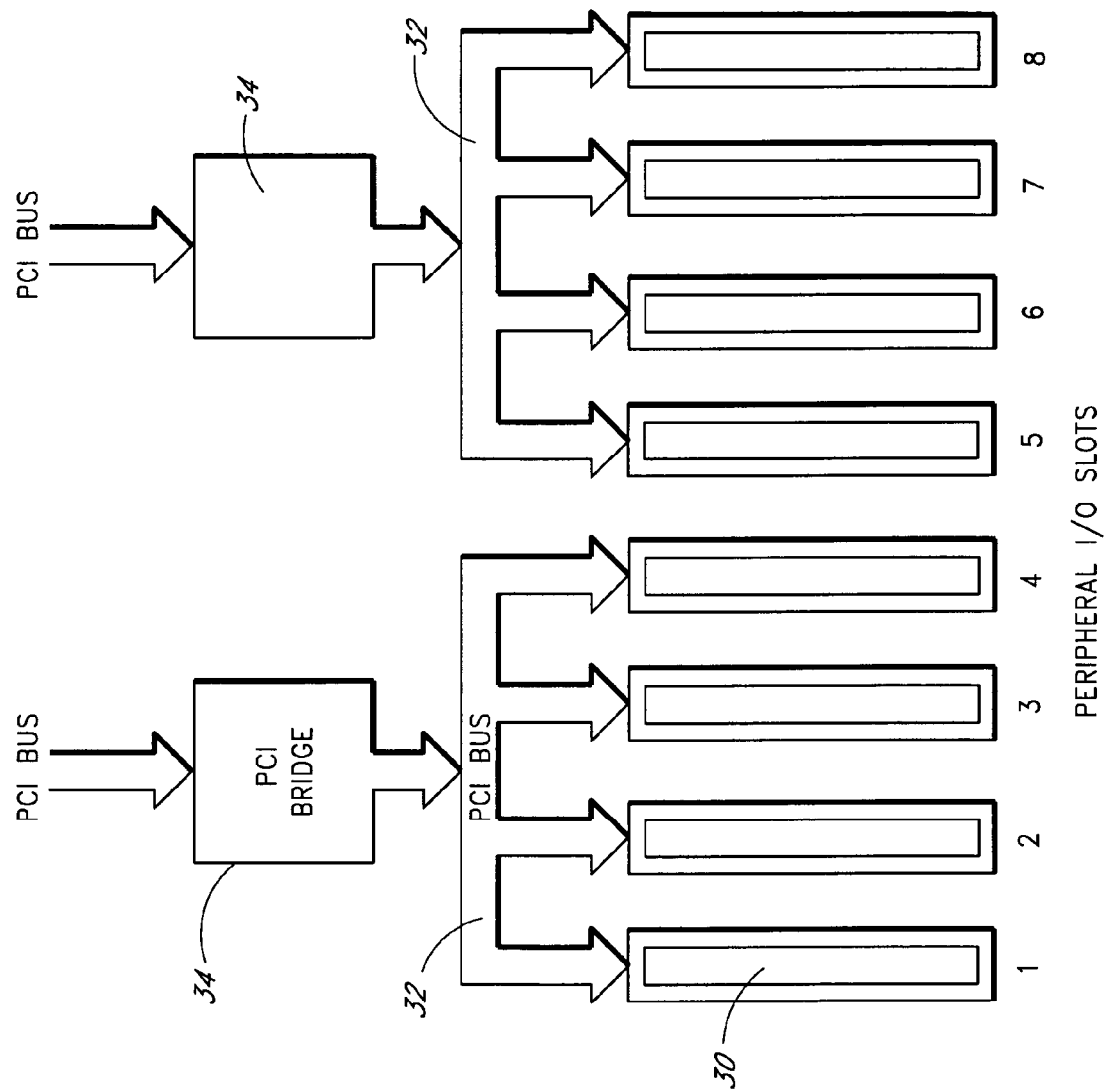
FIG. 2 is a diagram showing one embodiment of a server, having eight peripheral adapter slots.
Figure 3:
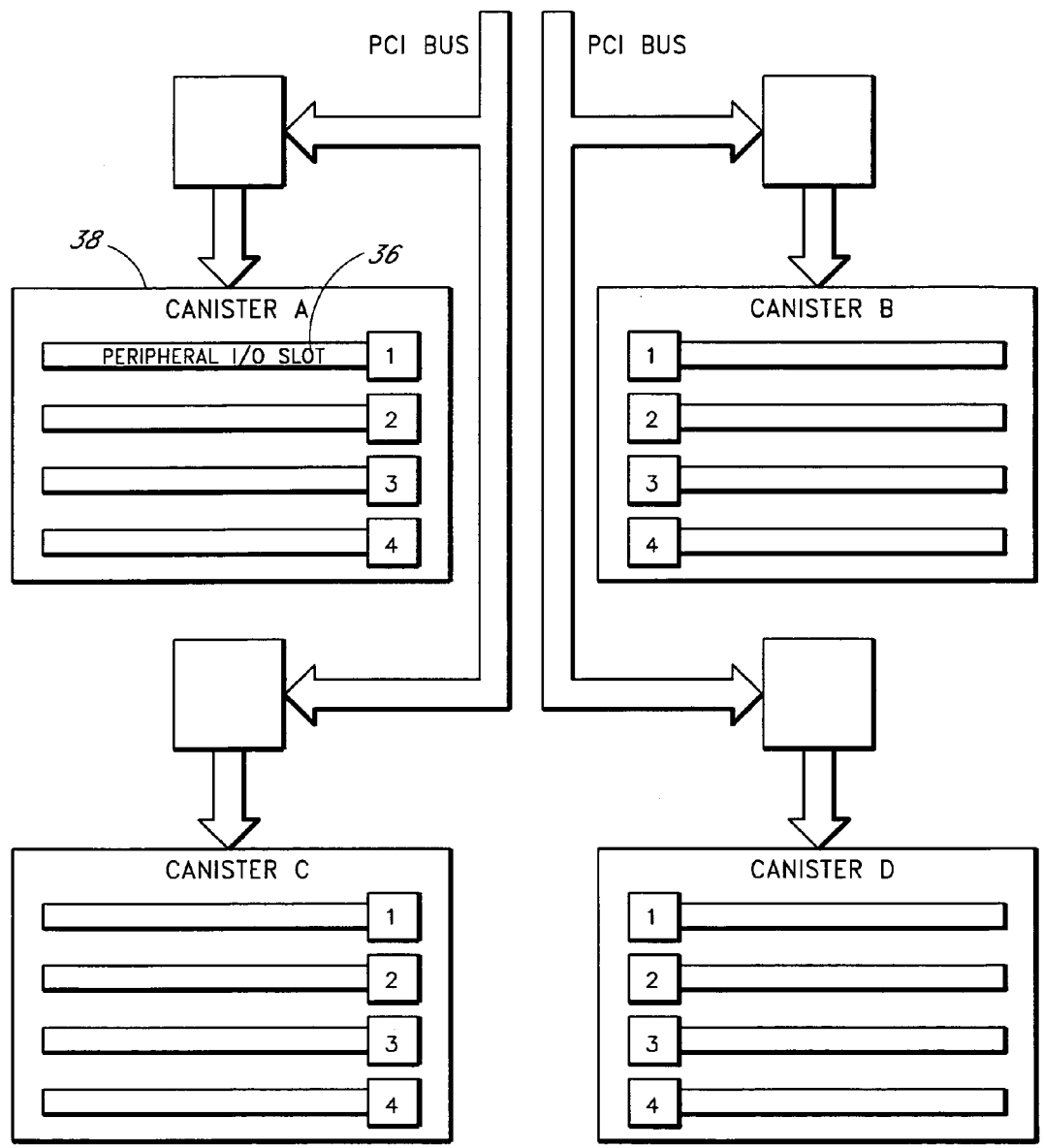
FIG. 3 is a diagram showing another embodiment of a server, having four canisters and sixteen peripheral adapter slots.

The server architecture shown in FIG. 2 represents the NetFRAME Model NF-9008 server. The NF-9008 supports eight (8) peripheral devices, or adapters, through eight (8) peripheral I/O slots 30. The slots 30 are individually powered and may be accessed directly from the PCI bus 32 and its associated bridge 34. The server architecture shown in FIG. 3 represents the NetFRAME Model NF-9016 server. The NF-9016 supports sixteen (16) peripheral devices through sixteen (16) peripheral I/O slots 36. The NF-9016 additionally uses canisters 38, which are groups of four slots. In the NF-9016 each canister is accessed by the PCI Bus 40 and an associated bridge 42. Thus, it is necessary to extract a canister to change or add a device to one of the slots inside the canister; therefore, all the other boards in the canister get shut down. In the NF-9008 each peripheral device can be replaced independently of the others.

Figure 4:
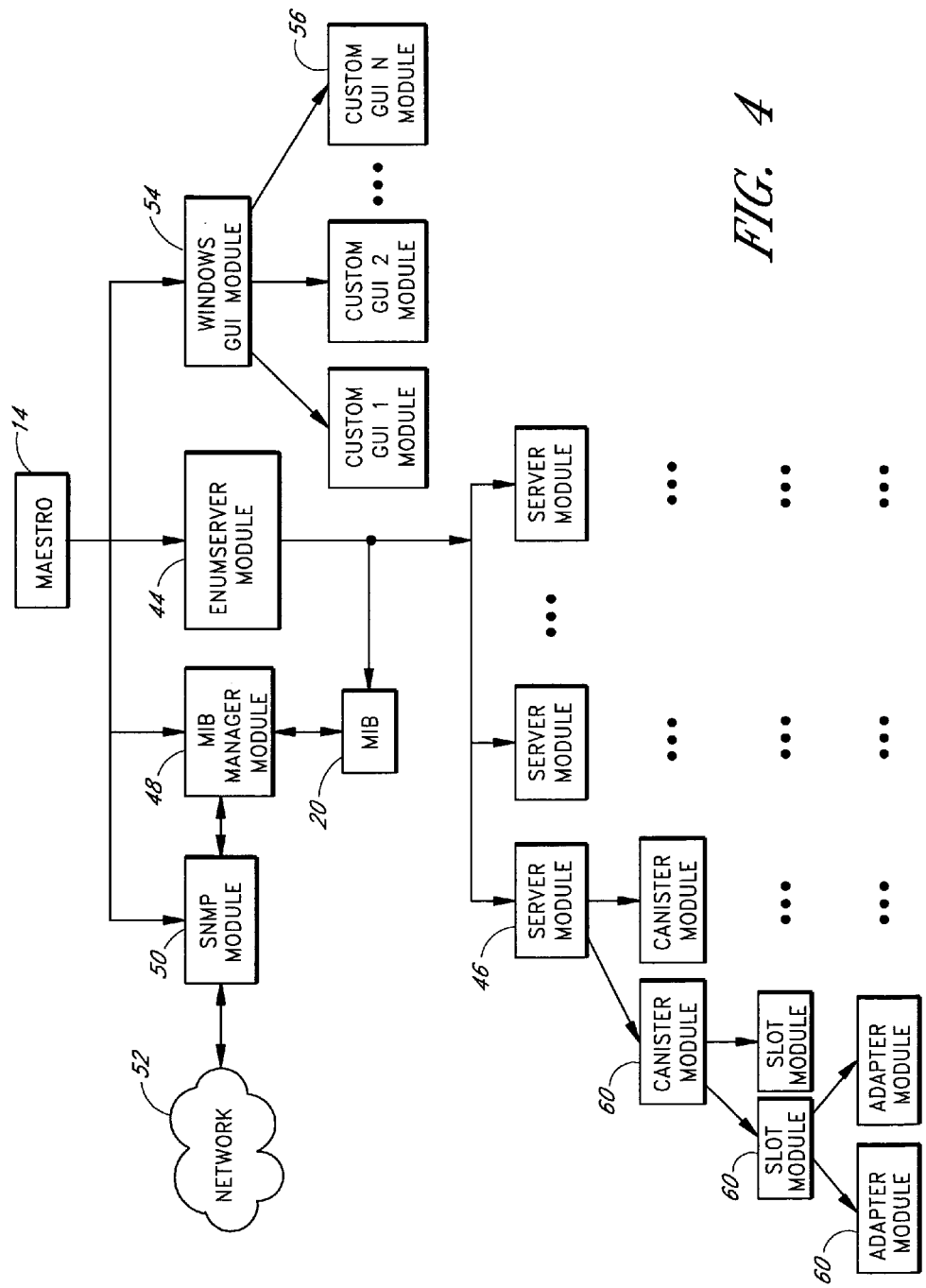
FIG. 4 is a logic block diagram illustrating the software modules that may be used to implement the functions of one embodiment of the present invention.

FIG. 4 shows the explicit modular software implementation of one particular embodiment of the invention. The specific implementation shown and hereinafter described is implemented in the Microsoft® Windows® environment using the C++ programming language. Other software implementations of the invention may be developed by those of ordinary skill in the art.

Upon start-up of Maestro 14, it creates a module called EnumServer 44 which retrieves information regarding how many network servers are present in the system, and then it creates Server Modules 46 for each of those servers. These and all other "modules" described herein are simply computer software elements that can issue commands to execute functions, including calling other modules, and store data. The use of software modules is well understood in the relevant art.

Thus, because one module is created for each server in the network, the Server Modules 46 provide a physical, one-to-one representation of the server network hardware. The Server Modules 46 transmit and receive information and commands to control their associated server through the MIB Manager Module 48, which uses the MIB 20 to translate the module variables and send commands to and from the SNMP Module 50, which can then send and receive logical numerical information over the network 52 to and from the SNMP Agents present at the server. The use of the MIB 20 is disclosed in detail in the copending application entitled "Data Management System Supporting Hot Plug Operations on a Computer," (U.S. application Ser. No. 08/942,149) as well as its related applications, filed Oct. 1, 1997 and hereby incorporated herein by reference.

The Windows® GUI Module 54 is a standard software module provided in the Microsoft® Windows® 95 and Windows® NT environments. This module implements the basic screen display format in the Microsoft® Windows® environment, which is used by one embodiment of the invention, NetFRAME's Hot Plug PCI Wizard, in creating its graphical user interface (GUI). The screen displays seen by the user upon the user's implementation of either the hot swap or hot add processes, shown herein in FIGS. 11 through 32, are customized GUI's implemented by the use of subsidiary Custom GUI Modules 56. For example, Custom GUI 1 Module 56 is used to create the screen display of FIG. 11, and it contains the data shown in that screen display, including the text, graphics, and select buttons. All of the other customized screen displays are similarly created by an associated Custom GUI Module in the Microsoft® Windows® 95 and Windows® NT environments.

All of the GUI modules for the hot swap/hot add processes are associated with each other, using software pointers, in a manner that will enable them to directly call different screen displays when necessary to create an appropriate sequence of screen displays to implement the hot swap or hot add process. For example, referring to FIG. 11, the "Back" button on the screen invokes a pointer to the previous custom screen module, the "Next" button invokes a pointer to the custom screen module representing the next step in the underlying process (i.e. hot add or hot swap), the "Cancel" button invokes a pointer to the initial custom screen module for the Hot Plug PCI Wizard, and the "Help" button invokes a pointer to a custom help screen module, which contains information to help answer the user's questions.

Referring again to FIG. 4, when the Hot Plug PCI Wizard is first accessed by the user within Maestro 14, it creates the Custom GUI Modules 56 for the hot swap and hot add processes. At that time, Maestro 14 also creates modules 60, associated with the server modules 46, representing all of the server canisters, slots, and associated adapters present in the server network. These modules, like the server modules, are able to access and hold data regarding the status of their associated hardware at the server, and issue commands that may be used to manipulate that associated hardware. For example, the Custom GUI module shown in FIG. 15, from which the user is able to power down a selected slot in a NF-9008 server, first calls the appropriate server Slot Module 60 (here the module for Slot 1 of a one-server NF-9008 network). The Slot Module 60 checks the status of its slotPowerState integer module variable to verify that the slot is powered up, and if so the Slot Module 60 can then issue a "PowerDown" command, through the MIB Manger Module 48 and SNMP Module 50 to the server, where the server hardware receives the instruction through an SNMP agent and executes the instruction to power down the slot. The particular slot is identified by data within the Slot Module 60, specifically the slotGroupNumber and slotNumber variables for this implementation of the invention. The values associated with these variables would be 1 and 1, respectively, for the first slot on the left, viewing the NF-9008 server from the front, 1 and 2 for the second slot from the left, and so on.

The appropriate canister and adapter modules 60 are called from the Custom GUI Modules 56, and commands issued therefrom, in an identical manner as will be understood by one of ordinary skill in the art. The specific module variables and data most often used in the hot swap/hot add processes are as follows for the particular modules:

| MODULE | VARIABLES |
|---|---|
| Canister Module | canisterMaximumNumberOfCanisters (=0 for NF-9008) canisterNumber canisterName canisterPowerState |

-continued

| MODULE | VARIABLES |
|---|---|
| Slot Module | slotGroupNumber |
| | slotNumber |
| | slotAdapterPresence |
| | slotPowerState |
| Adapter Module | adapterNumber |
| | adapterName |
| | adapterSupportsHotSwapHotAdd |
| | adapterState |
| | adapterCommand |

The module variable names are self-explanatory. Thus, within the Maestro 14 software framework, the Hot Plug PCI Wizard implementation of the present invention is able to use Custom GUI Modules 56 for each screen display that the user sees when performing a hot swap or hot add process. These custom screen displays are easily implemented, and are linked to the server modules 46, canister, slot, and adapter modules 60, which are in one-to-one correspondence with the actual server hardware, and which modules (1) provide the user with status information regarding that hardware, and (2) allow the user to easily implement high-level software commands over the network to control the server hardware during the hot swap and hot add processes.

Figure 5:
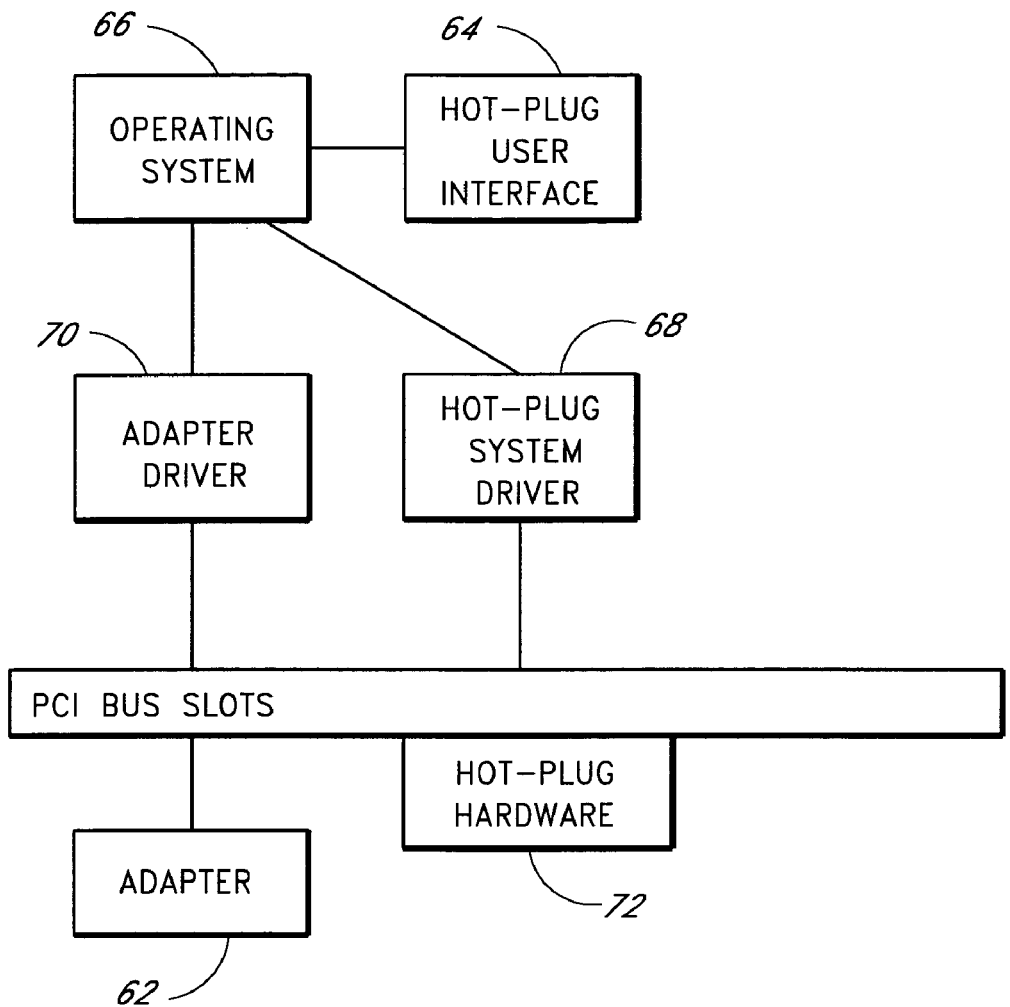
FIG. 5 is a block diagram illustrating the connection between a user interface and the peripheral adapters of a server which can be hot swapped or hot added, including other major parts of the system.

FIG. 5 shows the basic hardware components at the server that respond to instructions generated by the Custom GUI Modules 56 generated by the Hot Plug PCI Wizard software in Maestro 14. In FIG. 5, the specific instruction involved deals with hot swapping a peripheral adapter 62. As explained above, the server operating system could be Windows® NT or NetWare®, including others. First, the GUI 64 accepts a request by the user, such as a system manager or administrator, to perform a hot add or hot swap of a peripheral adapter 62 at the server. The GUI 64 transmits the user's instruction through the operating system 66 to the hot plug system driver 68 and the adapter driver 70 or drivers associated with the peripheral adapter 62. The hot plug system driver 68 controls the adapter driver 70 for a hot plug operation. The hot plug system driver 68 suspends and resumes the communications between the peripheral adapter 62 and the adapter driver 70. During the hot add or swap of the peripheral adapter 62, the hot plug hardware 72 deactivates the power to the peripheral adapter, allowing the user to remove it from the server and replace it with another peripheral adapter. One embodiment of the hot plug hardware 72 may include a network of microcontrollers to carry out this functionality. The peripheral adapter 62 could be any kind of peripheral device, such as a math co-processor, a sound board, or other devices well known in the art.

Figure 6:
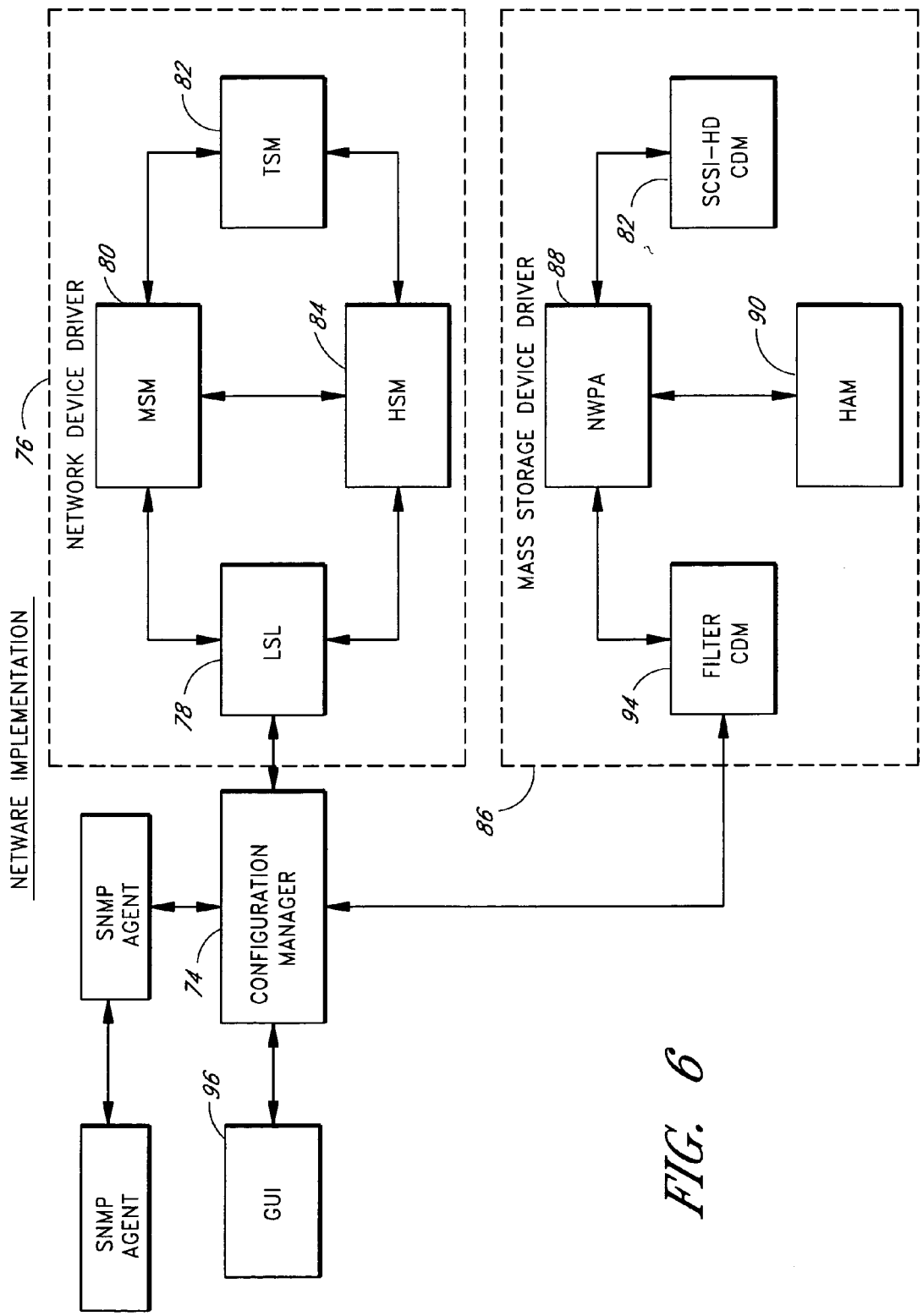
FIG. 6 is a block diagram illustrating one embodiment of the present invention in a network server running the NetWare® operating system.

FIG. 6 is a block diagram illustrating the system components of the NetWare® implementation of one embodiment of the present invention. A configuration manager 74 is responsible for managing all of the peripheral adapters. The configuration manager 74 keeps track of the configuration information for every adapter. The configuration manager 74 also allocates resources for every adapter and initializes each adapter during a hot swap operation. The GUI 96 initiates the requests to the configuration manager 74 to freeze and restart communications to a specified peripheral adapter.

Novell® has created two interfaces for adapter drivers to communicate with the Netware Operating Systems. First, Novell® has provided the Open Datalink Interface (ODI) for network drivers. Second, Novell® has created the Netware Peripheral Architecture (NWPA) for mass storage adapters. Each of these interfaces will be briefly described.

With respect to network device drivers, such as a driver 76, ODI was created to allow multiple LAN adapters to co-exist on network systems. The ODI specification describes the set of interface and software modules used by hardware vendors to interface with the NetWare® operating system. At the core of the ODI is the link support layer (LSL) 78. The LSL 78 is the interface between drivers and protocol stacks (not shown). A protocol stack is a layered communication architecture, whereby each layer has a well defined interface.

Novell® has provided a set of support modules that provide the interface to the LSL 78. These modules are a collection of procedures, macros and structures. These modules are the media support module (MSM) 80, which contains general functions common to all drivers, and the topology specific modules (TSM) 82, which provide support for the standardized media types of token ring, Fiber Distributed Datalink Interface (FDDI) and Ethernet. The MSM 80 manages the details of interfacing ODI multi-link interface drivers to the LSL 78 and the NetWare® Operating System. The MSM 80 handles all of the generic initialization and run-time issues common to all drivers. The topology specific module or TSM 82 manages operations that are unique to a specific media type. The Hardware Specific Modules (HSM) 84 are created by each adapter vendor for each type of peripheral adapter. The HSM 84 contains the functionality to initialize, reset and shutdown an adapter. The HSM 84 also handles packet transmission and reception to and from each adapter.

With respect to the mass storage device driver 86, the NetWare® Peripheral Architecture (NWPA) is a software architecture developed by Novell® which provides an interface for mass storage developers to interface with the NetWare® operating system. The NWPA is divided into two components: a host adapter module (HAM) 90 and a custom device module (CDM) 94. The HAM 90 is a component that contains information on the host adapter hardware. The CDM 94 is the component of the NWPA that regulates the mass storage adapters. The main purpose of the Filter CDM 94 is to locate each HAM 90, register for adapter events, and process the I/O suspend and I/O restart requests from the configuration manager 74.

Figure 7:
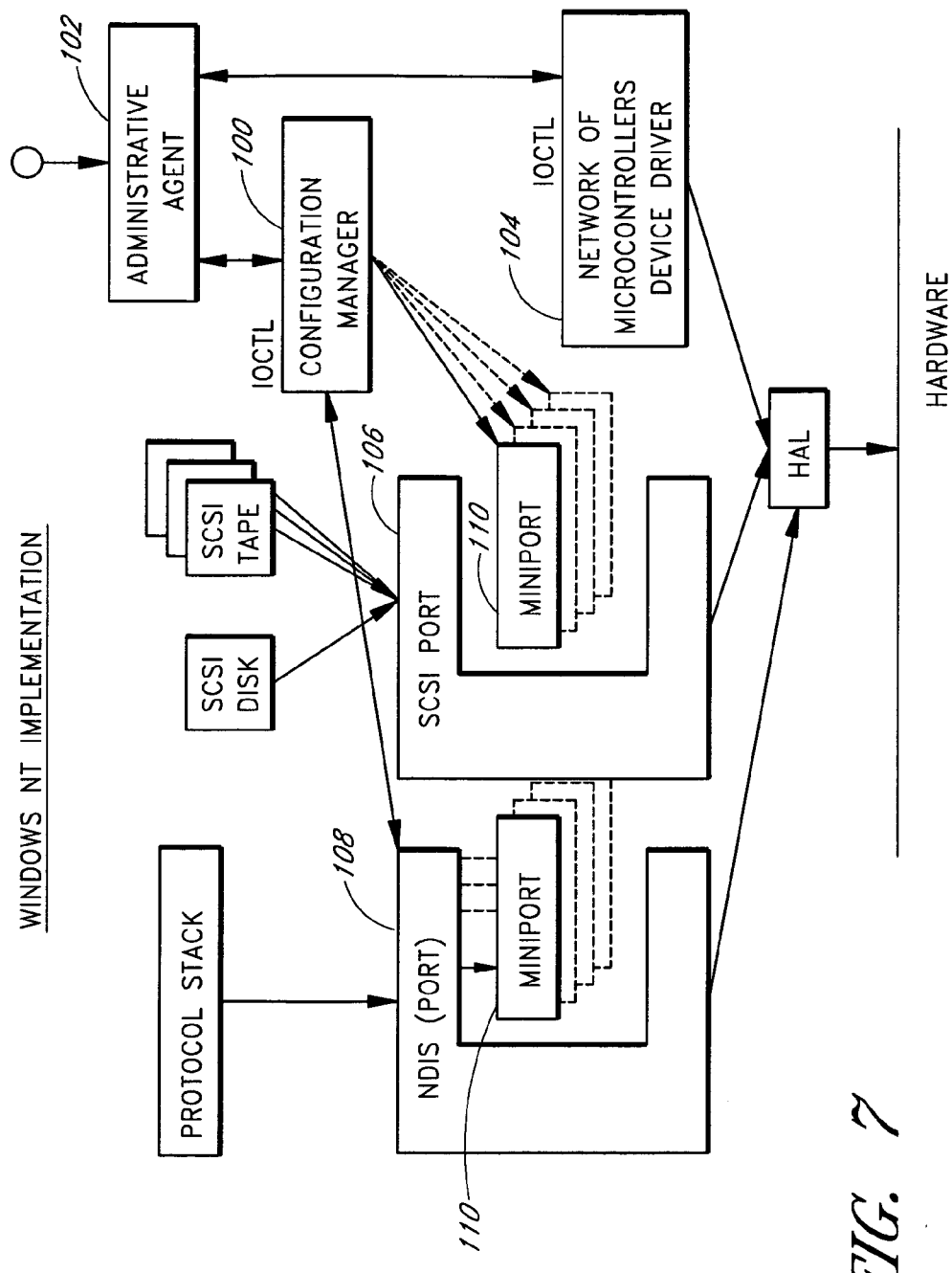
FIG. 7 is a block diagram illustrating one embodiment of the present invention in a network server running the Windows® NT operating system.

FIG. 7 is a block diagram illustrating various components of one embodiment of the present invention as implemented under the Windows® NT Operating System (WinNT). A configuration manager 100 controls the process of hot adding and swapping an adapter. An administrative agent 102 initiates requests to the configuration manager 100 and the network of microcontrollers to oversee the process of hot add and swap of an adapter. The administrative agent 102 initiates requests to the configuration manager 100 to suspend and restart the communications of a peripheral adapter. The administrative agent 102 initiates requests to the microcontroller network device driver 104 to turn on and off the power to the appropriate server slots.

The configuration manager 100 controls the communication between each adapter and adapter driver by calling the SCSI port 106 and NDIS 108. SCSI port and NDIS are interfaces which are exported by the Windows® NT Operating system and which are imported, respectively, into mass storage and network adapter drivers. These interfaces are designed to interact with a miniport 110 which is an instance of an adapter driver. In Windows® NT, each adapter (type of adapter if reentered) will have its own miniport.

The remaining FIGS. 8 through 32 delineate the hot swap and hot add processes as implemented by a user according to one embodiment of the invention, the Hot Plug PCI Wizard software. The Hot Plug PCI Wizard can operate in both the Windows® NT and NetWare® server environments, and the differences between those two implementations are noted herein.

Figure 8:
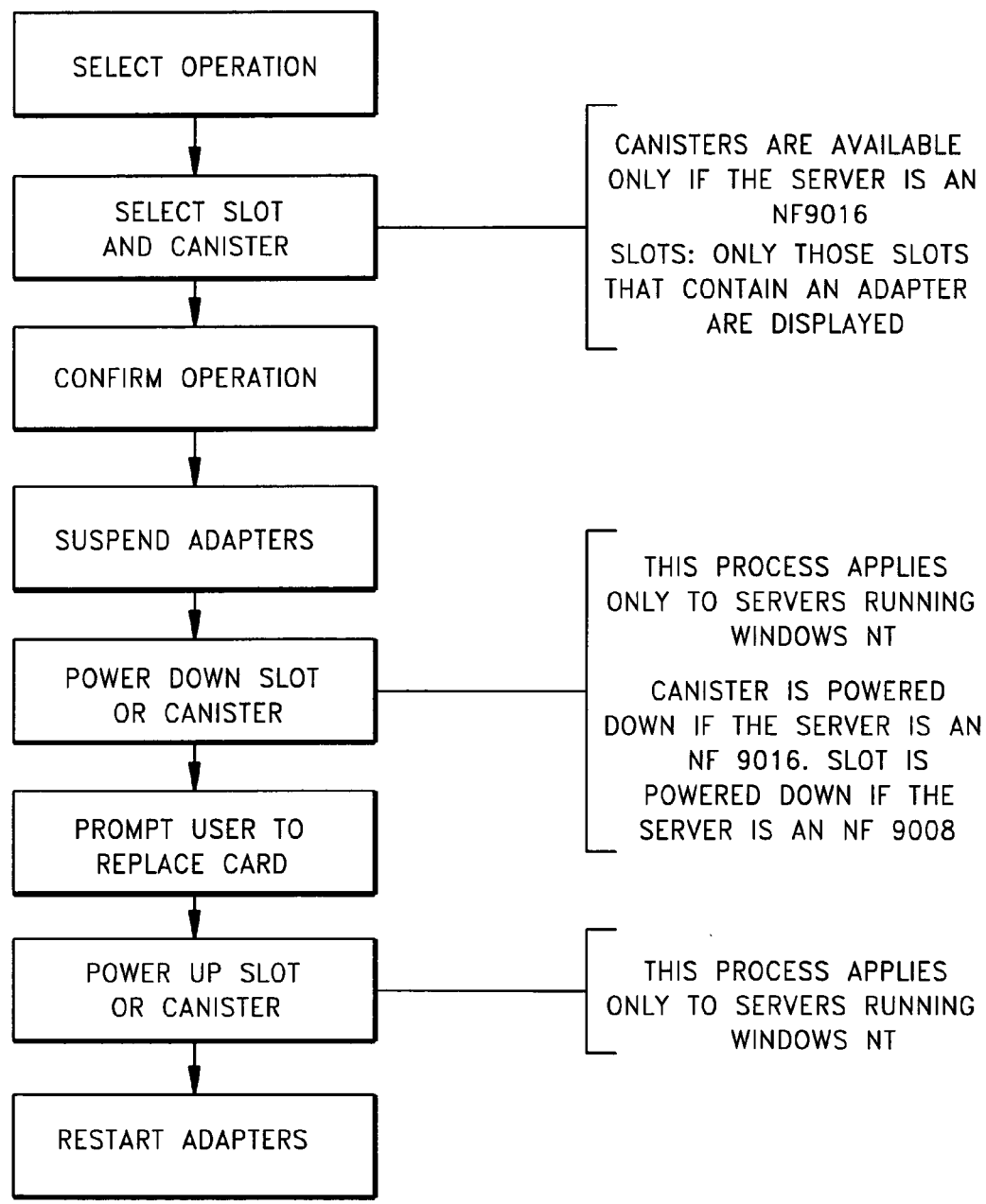
FIG. 8 is a flow diagram illustrating the steps of one embodiment of a hot swap process.
Figure 26:
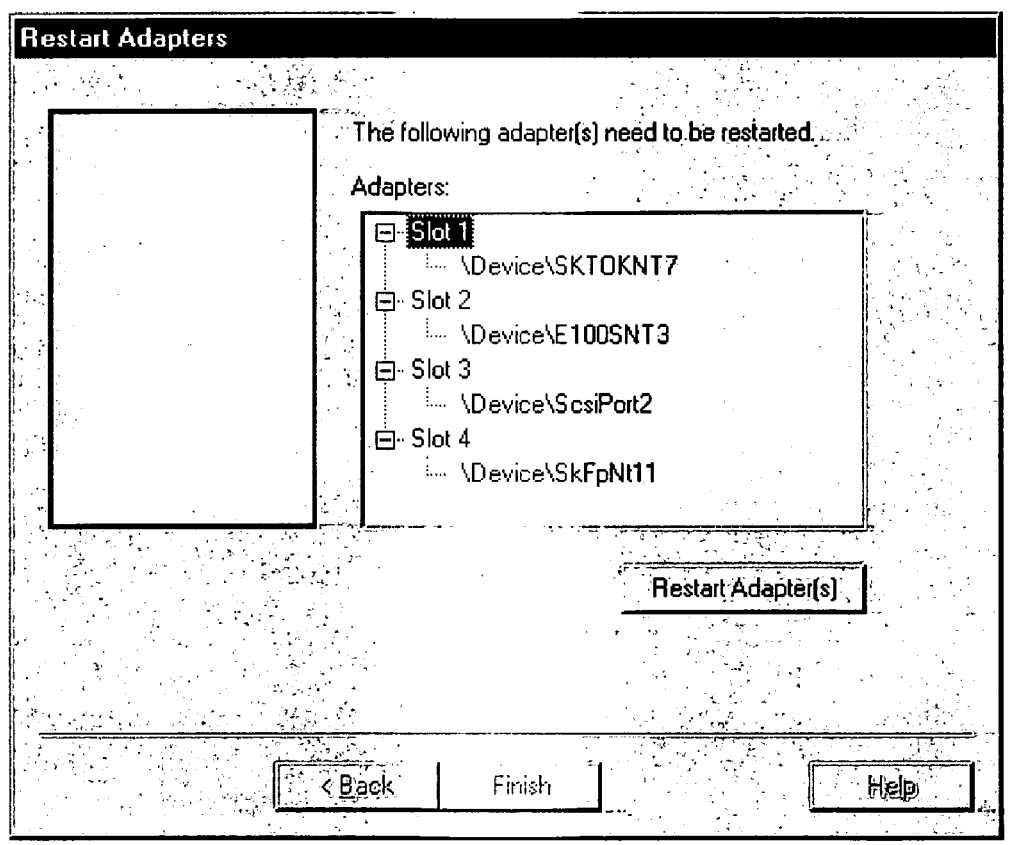

FIG. 8 shows the steps performed in the hot swap process under either the Windows® NT or the NetWare® operating environments. The custom GUI screen displays corresponding to each step in the hot swap process are shown in FIGS. 111 through 26. Before beginning the hot plug or hot add process, the user first accesses, through a network map window icon or menu, the server management window for the particular server of interest. The user can then enter the Hot Plug PCI Wizard to perform the hot swap or hot add process.

Figure 11:
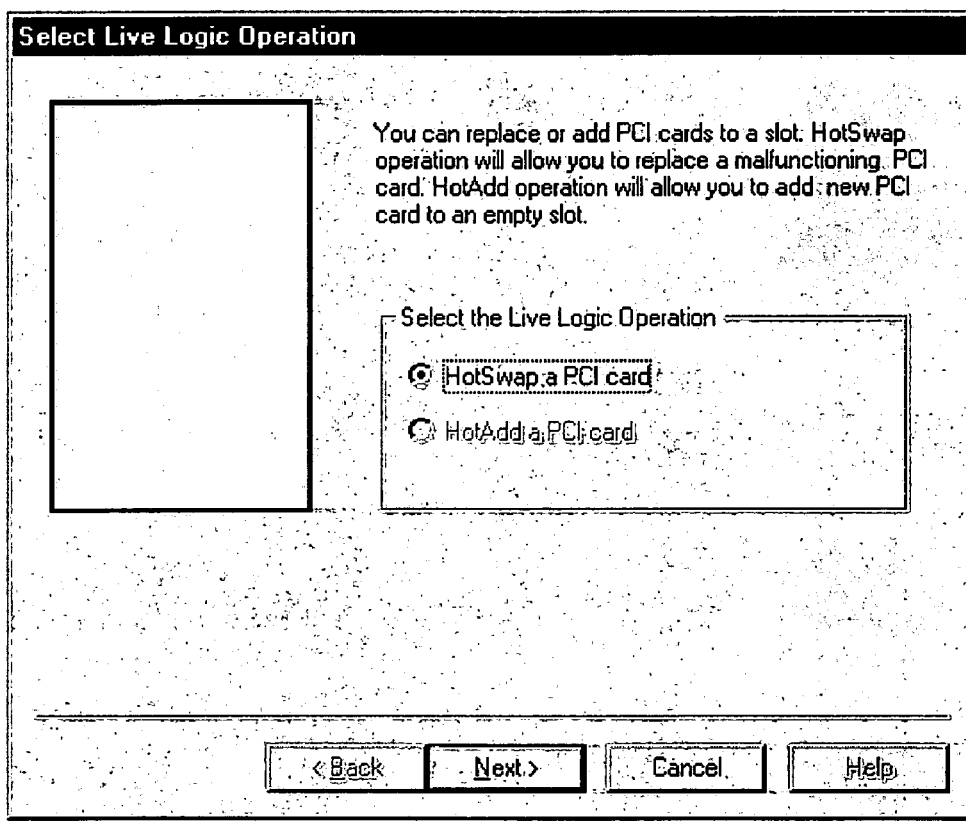
FIGS. 11 through 18 show the screen displays generated by one embodiment of the graphical user interface for a hot swap process implemented in the NF-9008 server environment.
Figure 12:
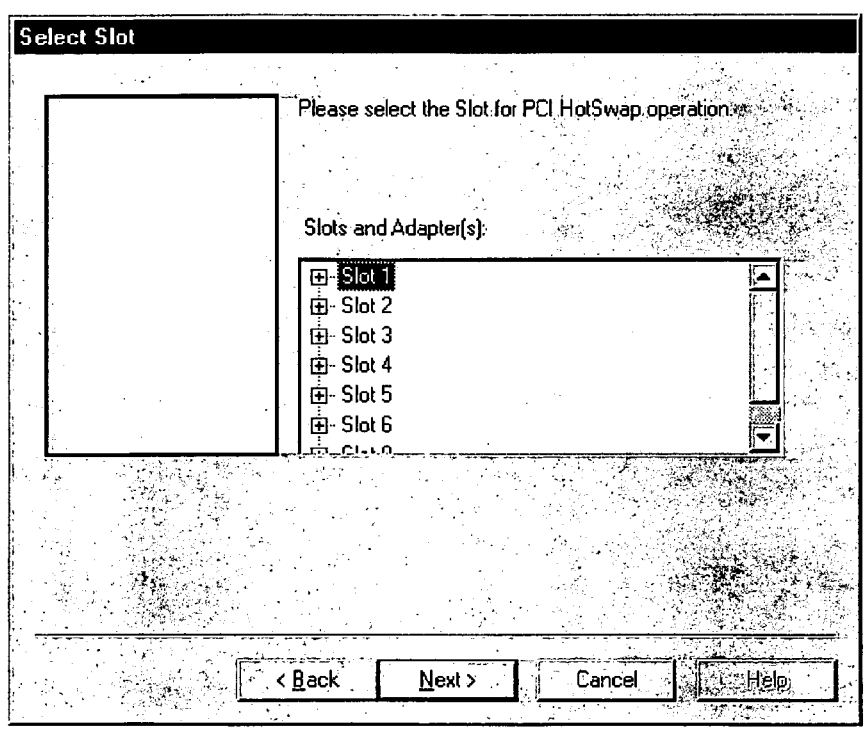
Figure 19:
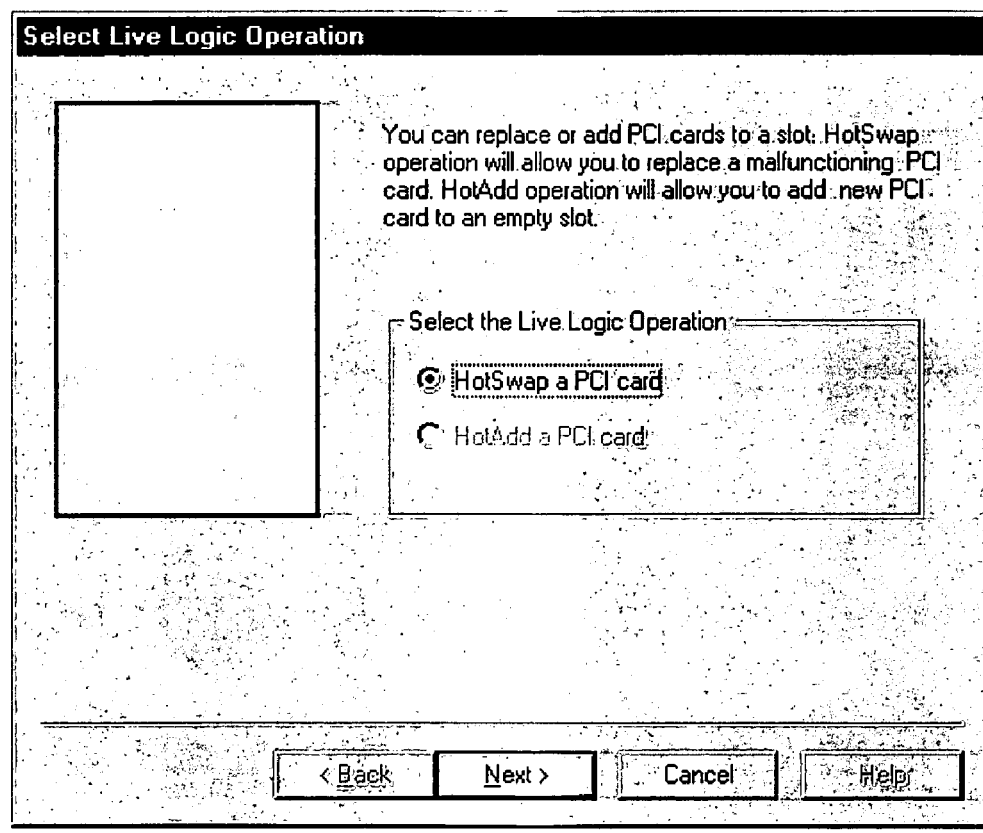
FIGS. 19 through 26 show the screen displays generated by one embodiment of the graphical user interface for a hot swap process implemented in the NF-9016 server environment.

At the first screen, the user performs the first step, Select Operation, to select the operation they wish to perform—either "Hot Swap a PCI card" or "Hot Add a PCI card" (see FIGS. 11 and 19). In this case the user selects the former. Upon this selection the Custom GUI Module 56 for that screen retrieves data from the appropriate server module 46 to identify whether the server is a NF-9008, having 8 slots, or a NF-9016, having 4 canisters. The server module 46 obtained this information using the SNMP Module when the user started Maestro 14.

At the next screen the user selects the specific peripheral device slot where they wish to perform the hot swap operation. At this screen, the display varies depending on whether the server of interest is a Model NF-9008, having 8 independent slots, or NF-9016, having 4 canisters housing 4 slots each. The Custom GUI Module 56 identifies the server by retrieving that information from the server module 46 (see FIG. 4), and then incorporates that knowledge to create either the customized screen display of FIG. 12 or FIG. 20. Thus, if the server is a NF-9008, the user will be displayed FIG. 12, in which case the user will then select (i.e. single-click) on the slot of interest. If the server is a NF-9016, the user will be displayed FIG. 20, in which case the user will select the canister first, and then select the appropriate slot within that canister. As noted in FIG. 4, in either case, the user will only be allowed to select slots that contain adapters, because only those support the hot swapping process. The Custom GUI Module 56 accesses the adapter modules 60 (see FIG. 4) to determine which ones (if any) are not hot swappable. This information is contained in the adapter module variable called "adapterSupportsHotSwapHotAdd."

Figure 13:
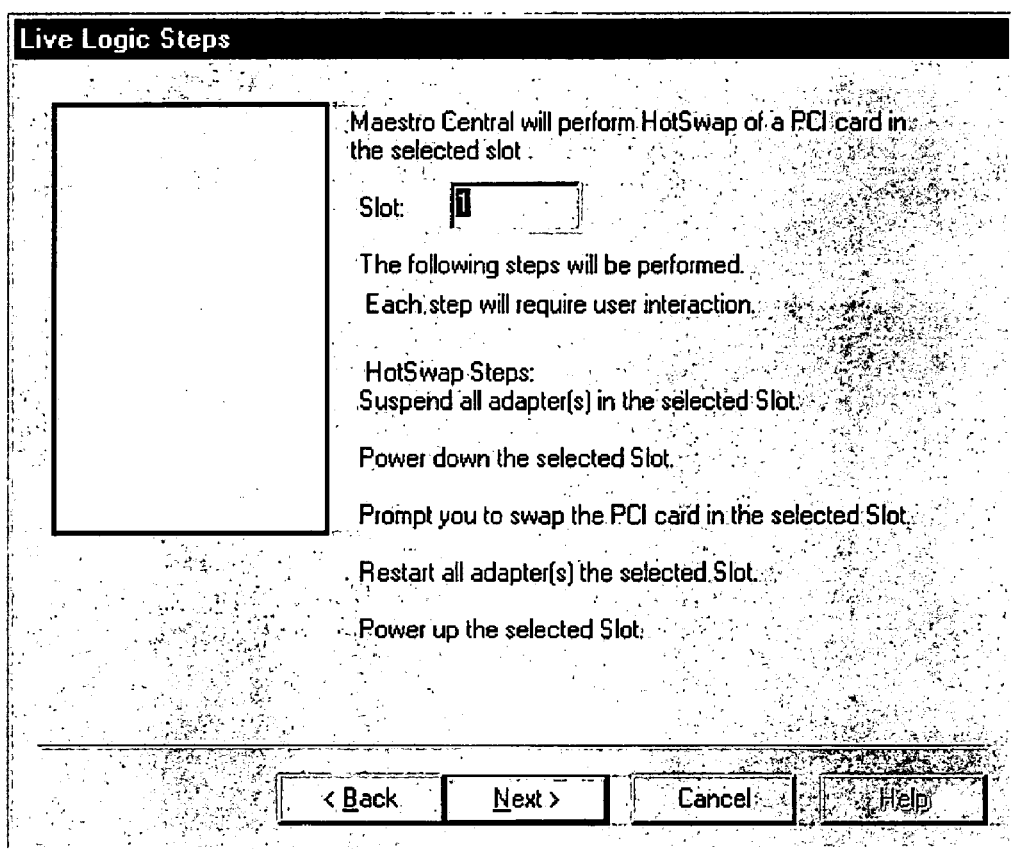
Figure 14:
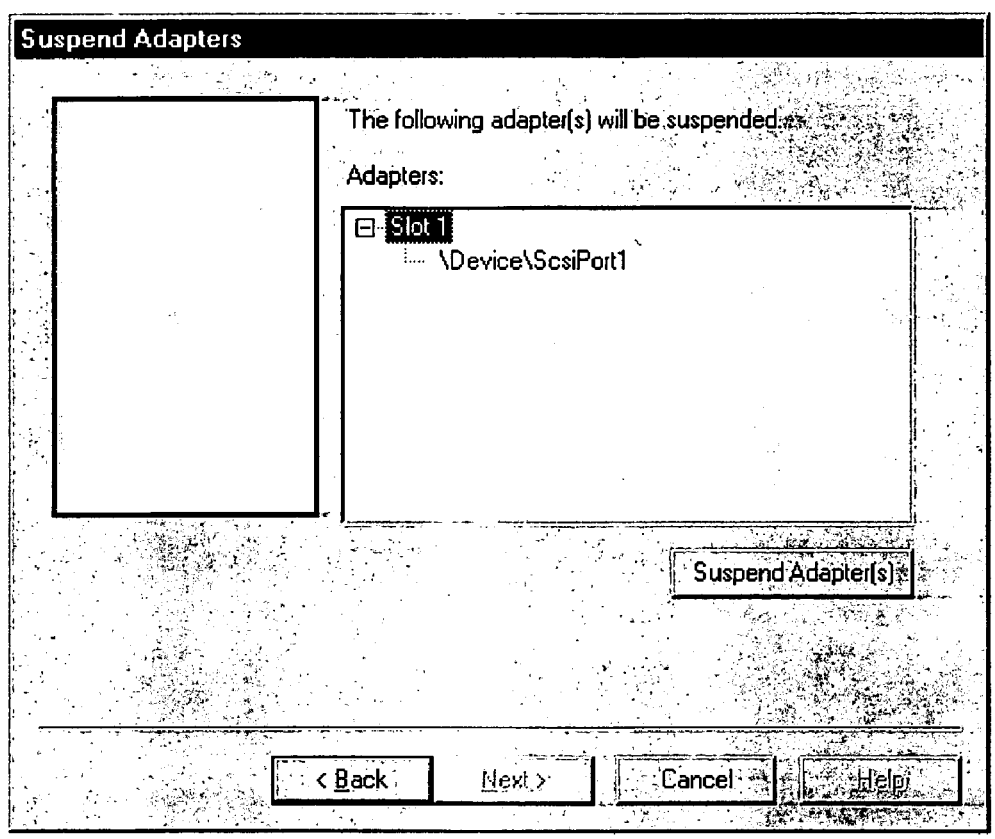
Figure 21:
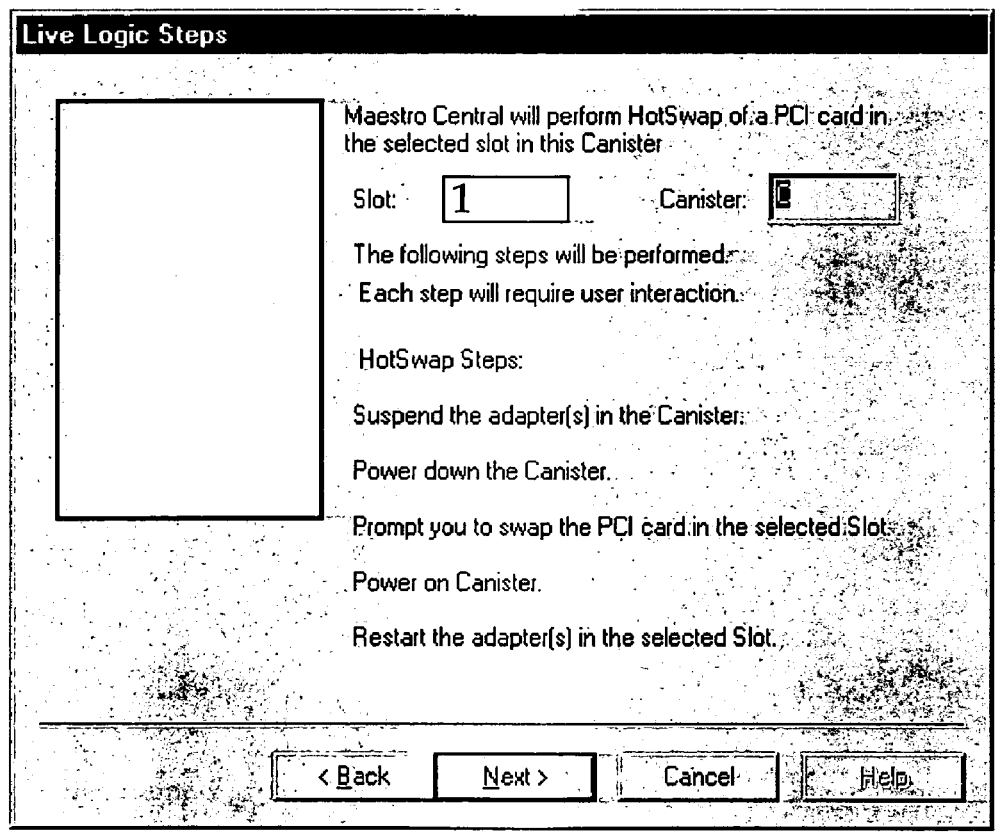
Figure 22:
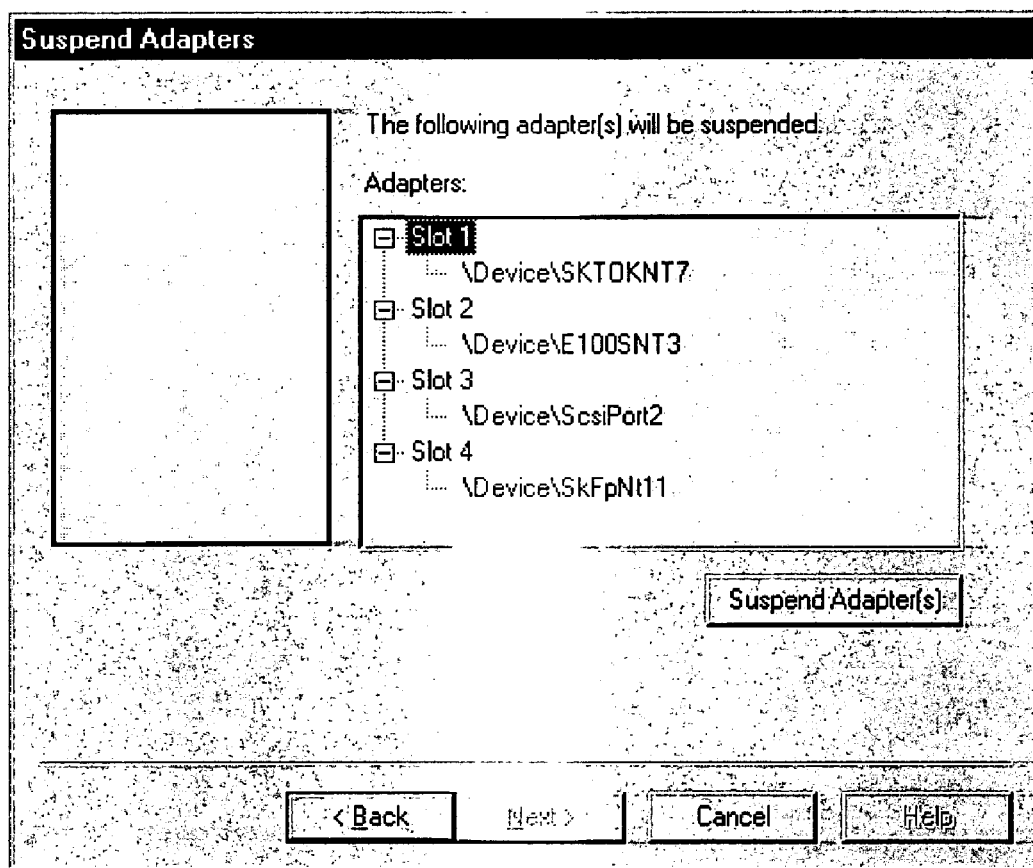

Again referring to FIG. 8, the third step in the hot swap process is simply a confirmation screen, which allows the user to see the steps that the software will instruct the server hardware to perform, and prompts the user to continue when ready (see FIGS. 13 and 21). Next, the hot swap process begins at the server with the suspension of the requested slot adapters, upon the user activating the "Suspend Adapter(s)" button on the screen (see FIGS. 14 and 22). Upon receiving this instruction, the Custom GUI Module for that screen prompts the specified adapter module(s) to send an adapterCommand, "SuspendOperations," to the MIB Manager Module, which then transfers this message to the SNMP Module. The SNMP Module can then send this SuspendOperations command over the network via the SNMP, to the SNMP Agent. The SNMP Agent then transmits the command to the server hardware, and the appropriate hardware devices are engaged to suspend the affected adapter(s).

Once the adapters are suspended, the SNMP Agent transmits that status information back over the network to the SNMP Module and back through the MIB Manager Module, to the adapter object. The state of the adapterState variable in the adapter module is updated to "Suspended," and the next Custom GUI module is in communication with this module to recognize that the appropriate adapters have been suspended and the GUI can then move on to the next step in the process. As noted in FIG. 8, for a server running in the NetWare® environment, only one step is required to both suspend the appropriate adapters and power down the appropriate slot or canister. Thus, the next step for a NetWare® implementation is to actually swap out the intended card.

Figure 15:
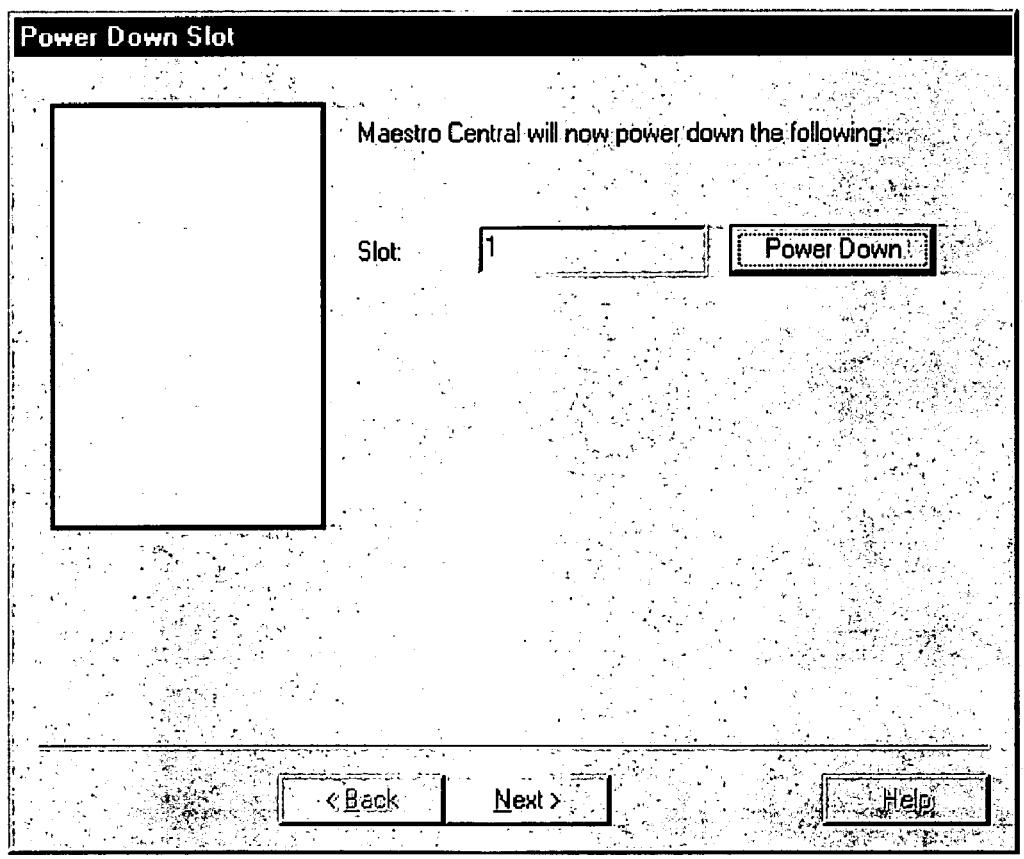
Figure 16:
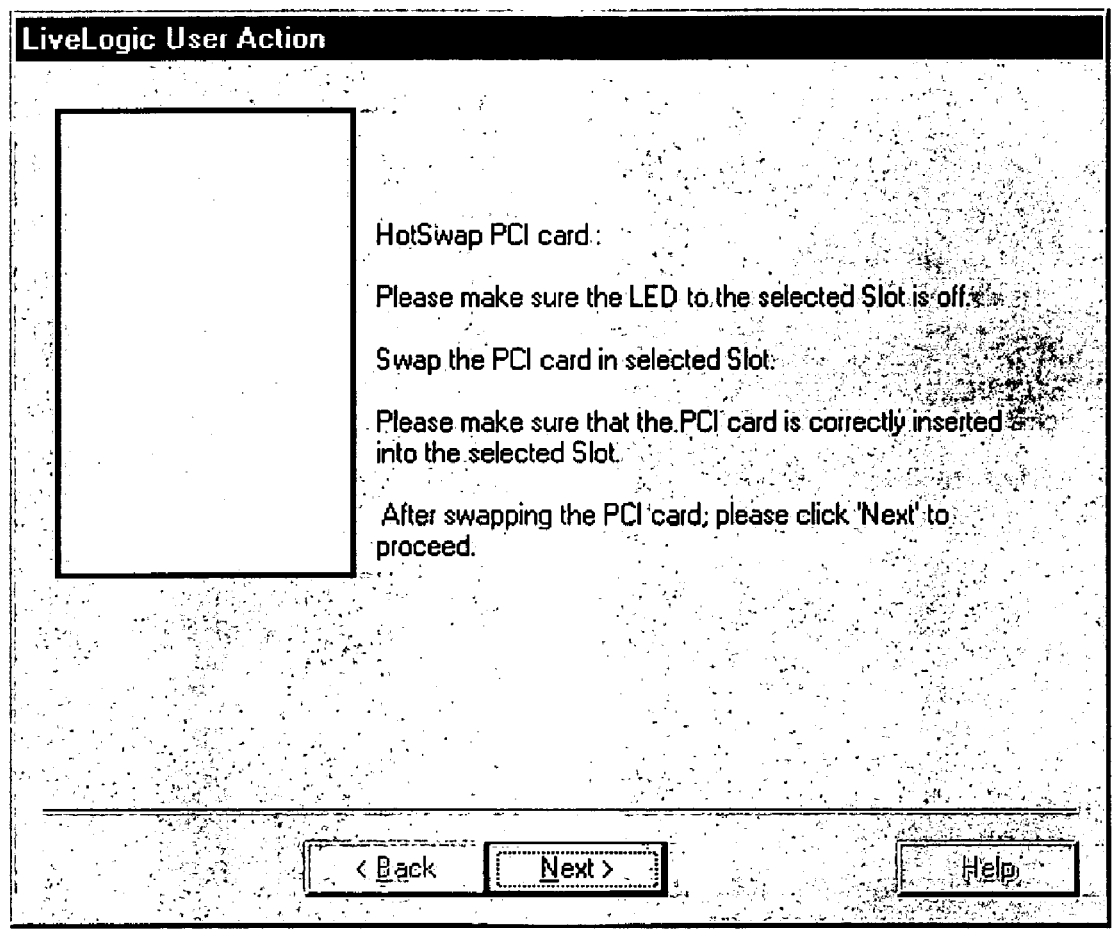
Figure 17:
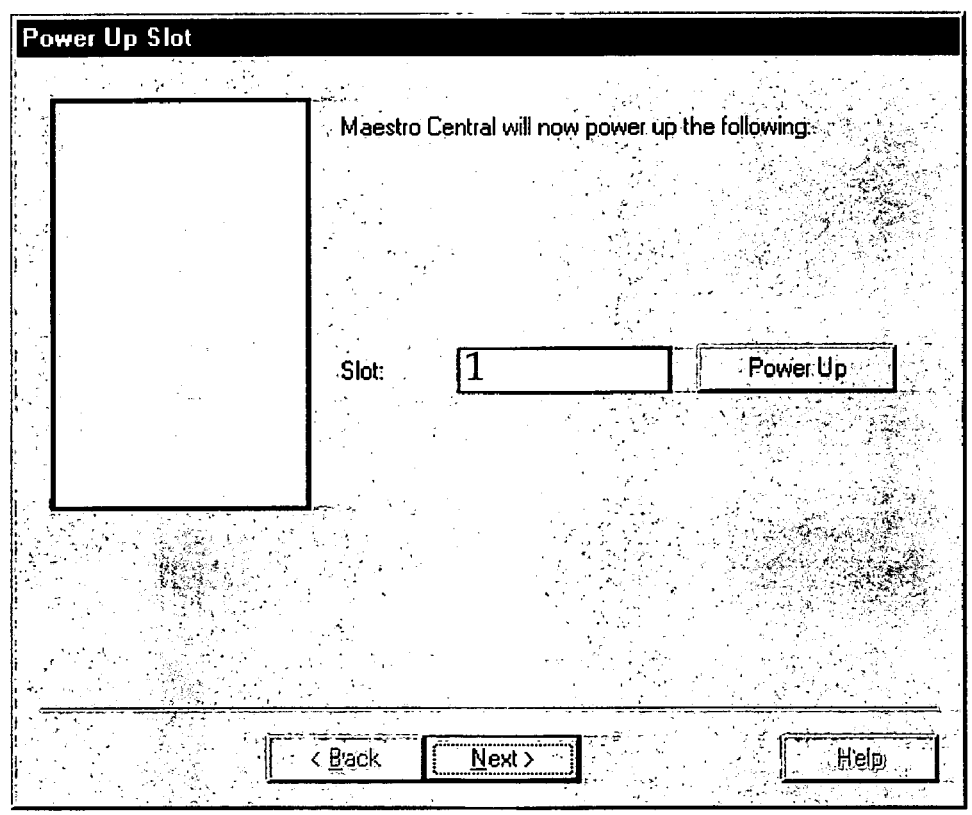
Figure 18:
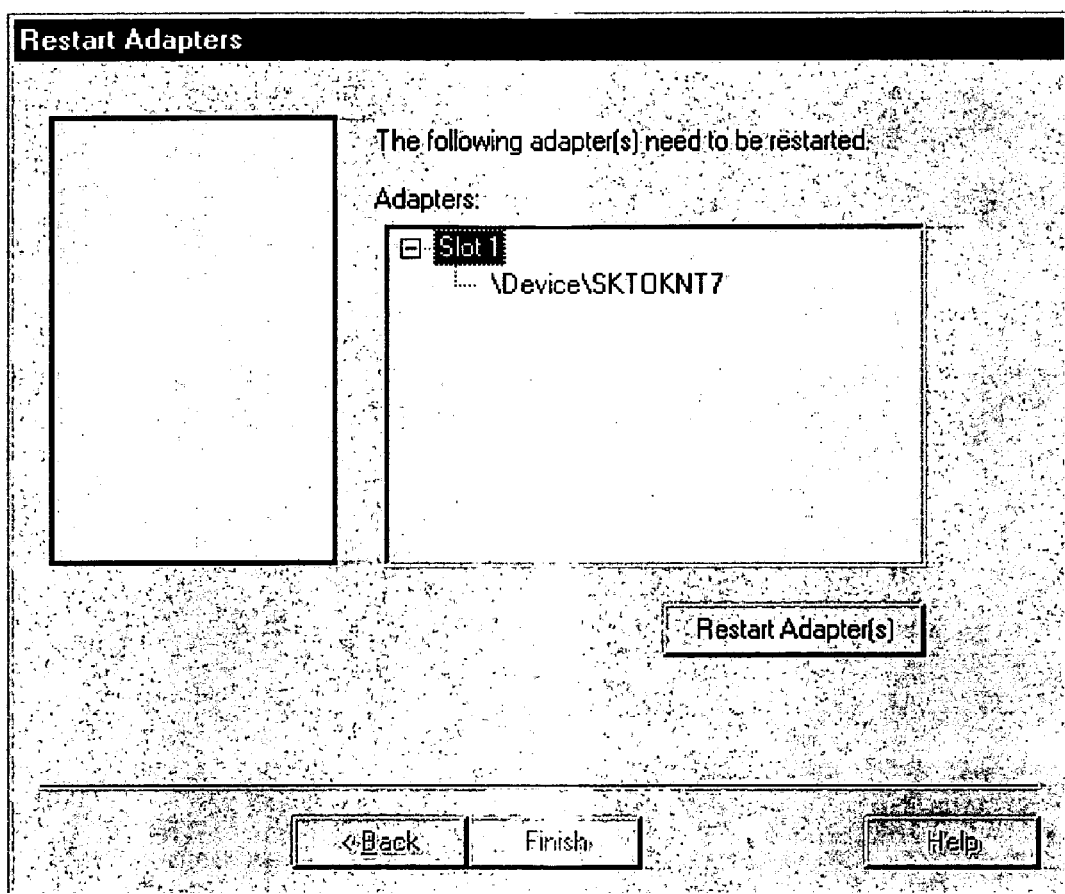
Figure 23:
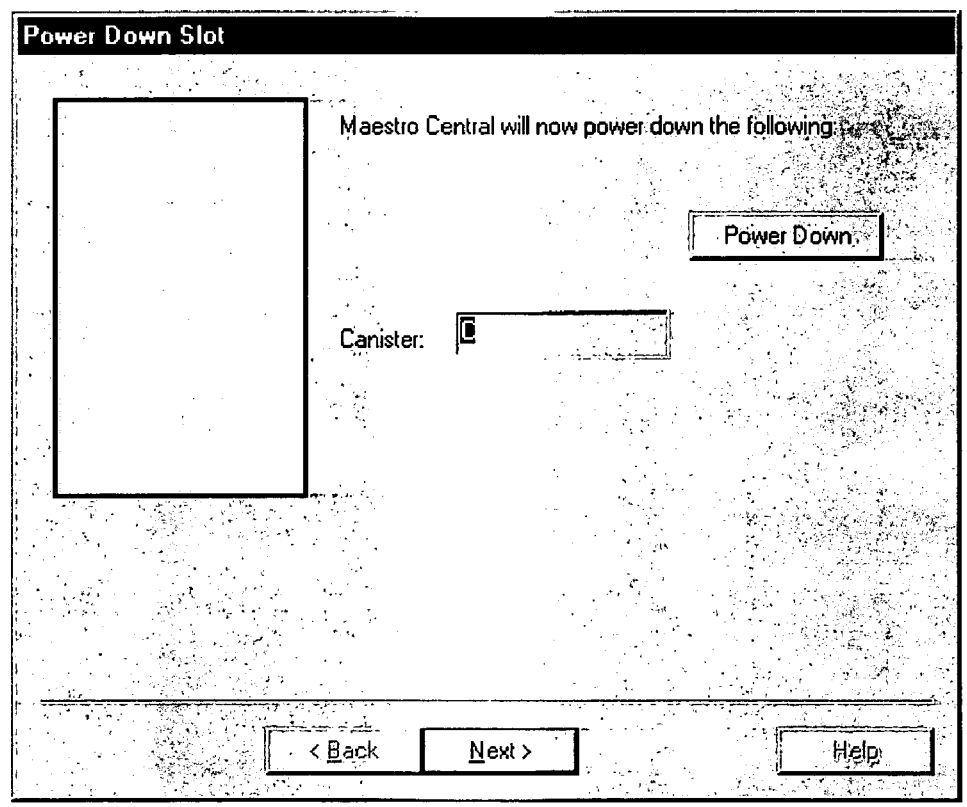
Figure 24:
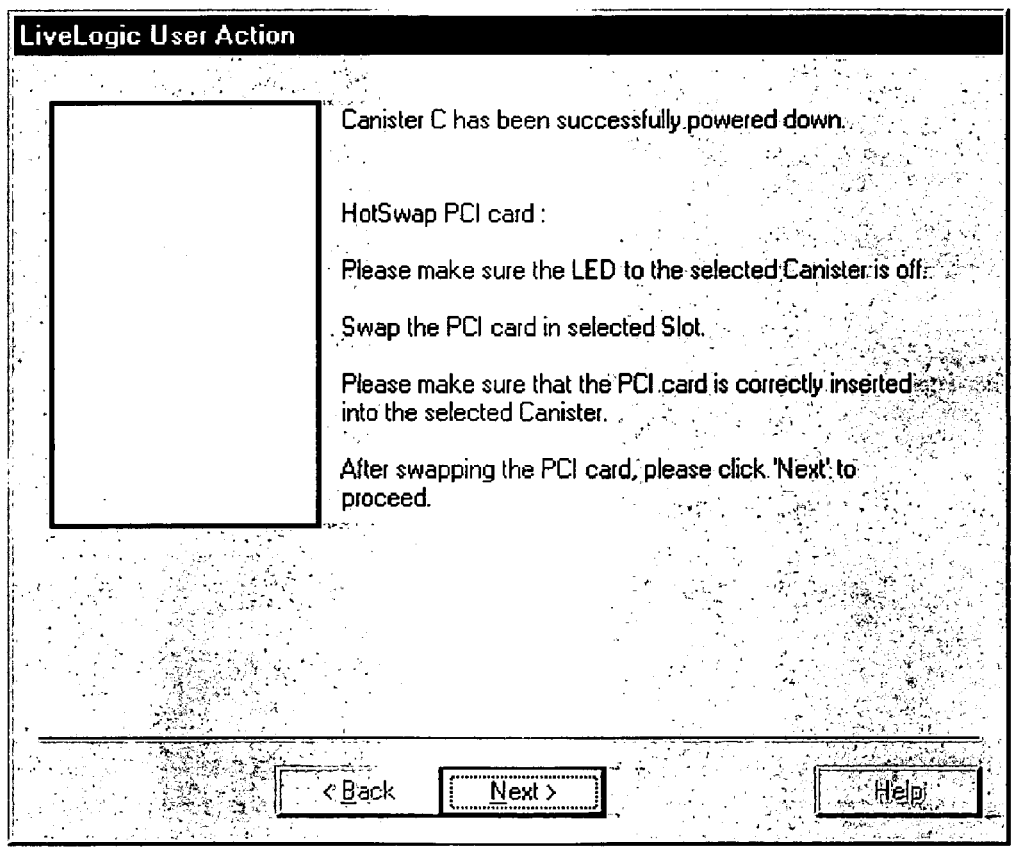
Figure 25:
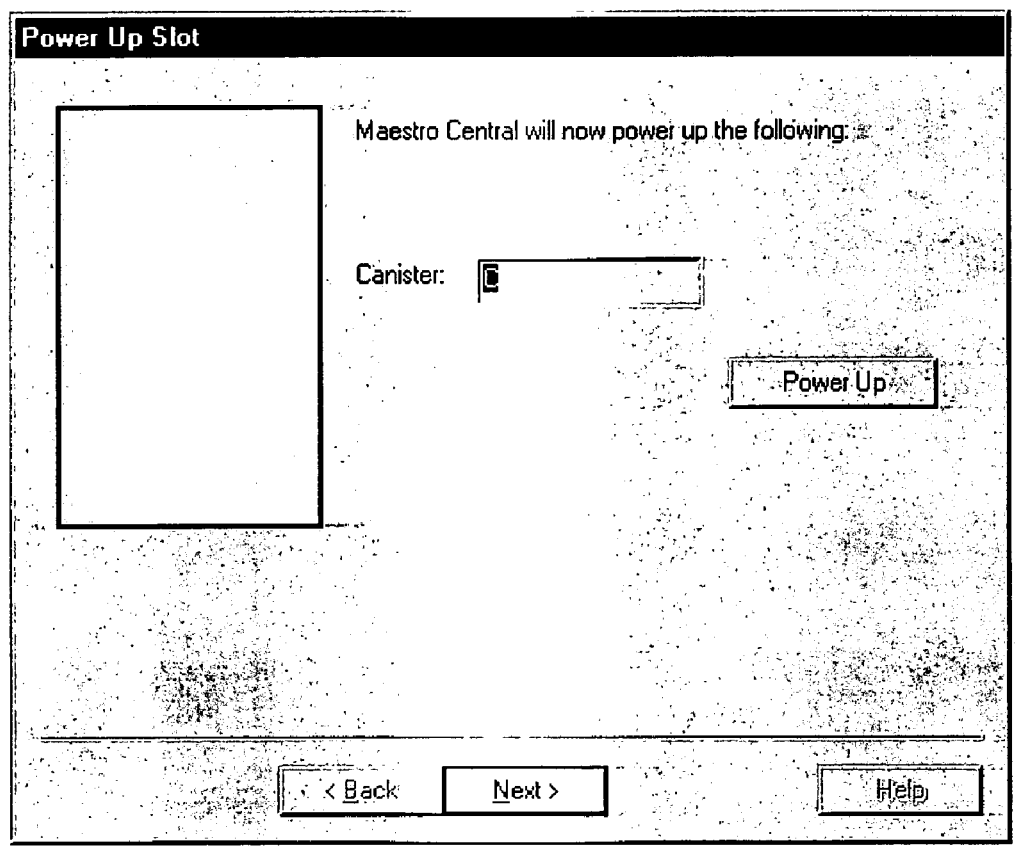

The next step for a Windows® NT implementation is to power down the appropriate slot, if the server is a NF-9008, or the appropriate canister, if the server is a NF-9016. In the NF-9016, individual slots may not be powered down; instead, the power must be suspended to the entire canister. The screen displays for the power down steps are shown in FIGS. 15 and 23. Once again, the Custom GUI Module 56 for this step receives the user's confirmation to go ahead with this step, and the module then proceeds to access the slotPowerState or canisterPowerState variable information from the slot or canister module 60, transmit a "PowerDown" command to the MIB Manager Module 48 and through the network via the SNMP Module 50. Once the appropriate slot or canister is powered down, the slotPowerState or canisterPowerState receives that information and updates the slot or canister module 60, and the Custom GUI Module recognized from that information that it may proceed to the next step in the hot swap process.

In either the NetWare® or Windows® NT environment, the next step in the hot swap process is to prompt the user to replace the peripheral card in the selected slot. This allows the user to physically go to the server, find the appropriate slot, and swap out and replace the peripheral card. The screen display for this step, shown in FIGS. 16 and 24, includes instructions to the user to make sure the LED light at the selected slot is off, and to make sure that the new card is correctly inserted into the slot. Again, once the user has finished this step, the screen display prompts the user to double-click on the "Next" button to proceed to the next step in the hot swap process. For the Windows® NT environment, the nest step is to power back up the affected slot or canister (see FIGS. 17 and 25), which the Custom GUI Module 56 for that screen display accomplishes by instructing the slot or canister module 60 to issue a "PowerUp" command to the MIB Manager Module 48 and through the network via the SNMP Module 50. Once the appropriate slot or canister is powered back up, the slotPowerState or canisterPowerState receives that information and updates the slot or canister module 60, and the Custom GUI Module recognized from that information that it may proceed to the next, and final, step. As stated above, in the NetWare® environment, this step is not necessary.

The final step in the hot swap process is to restart the adapters that were previously suspended before swapping out the peripheral card. This step is performed by the user from the last screen display, shown in FIGS. 18 and 26, by the user activating the "Restart Adapter(s)" command. The "Restart Adapter(s)" command prompts the adapter module 60 to issue a "ResumeOperations" command to the MIB Manager Module 48 and through the network via the SNMP Module 50. Once the user receives confirmation through the adapter module that the state of the adapters (i.e. adapterState) is "Active," the swapped peripheral card may be used in the server.

Figure 9:
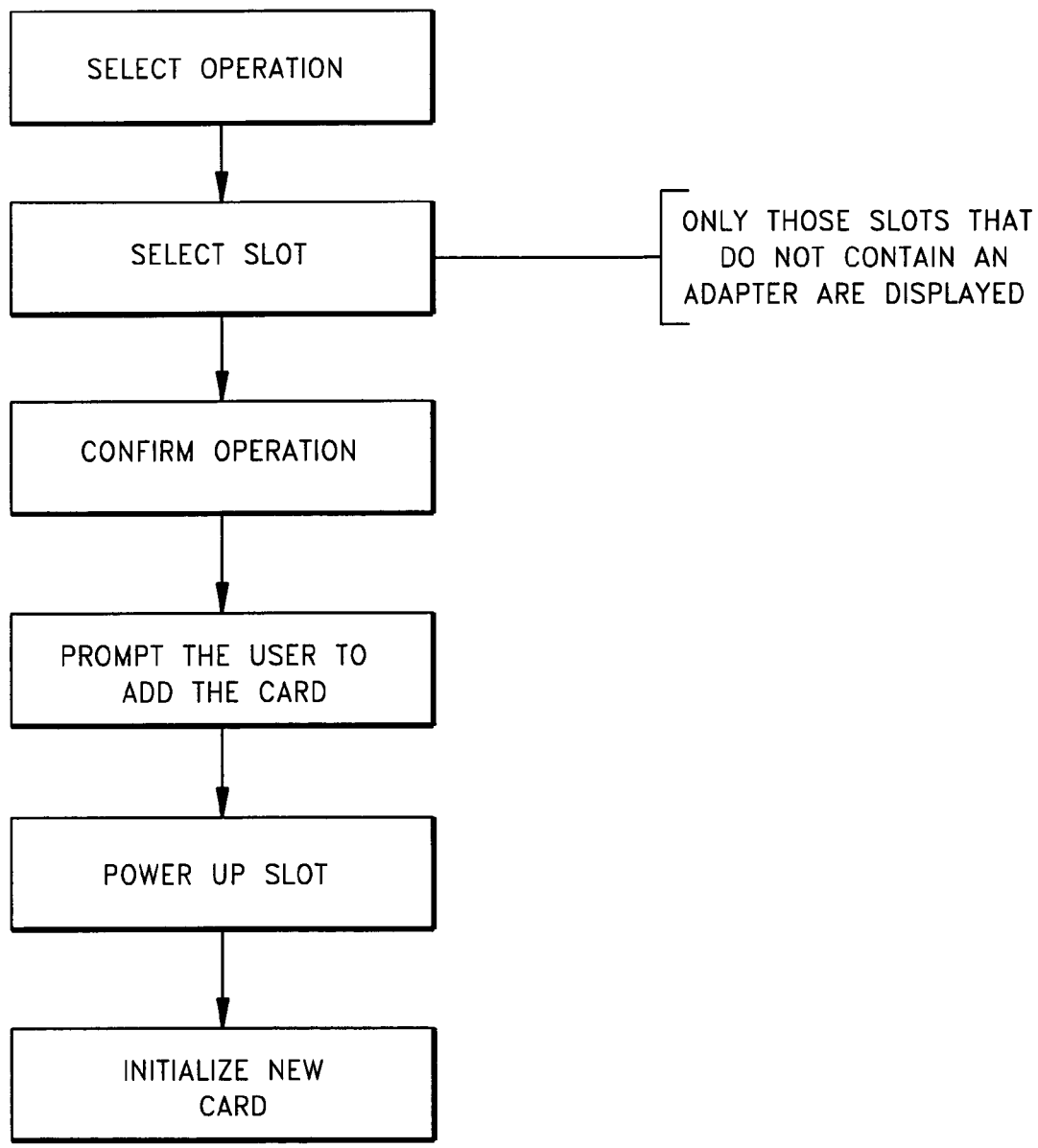
FIG. 9 is a flow diagram illustrating the steps of one embodiment of a hot add process for a server having independent peripheral device slots (NF-9008) and running the NetWare® operating system.
Figure 10:
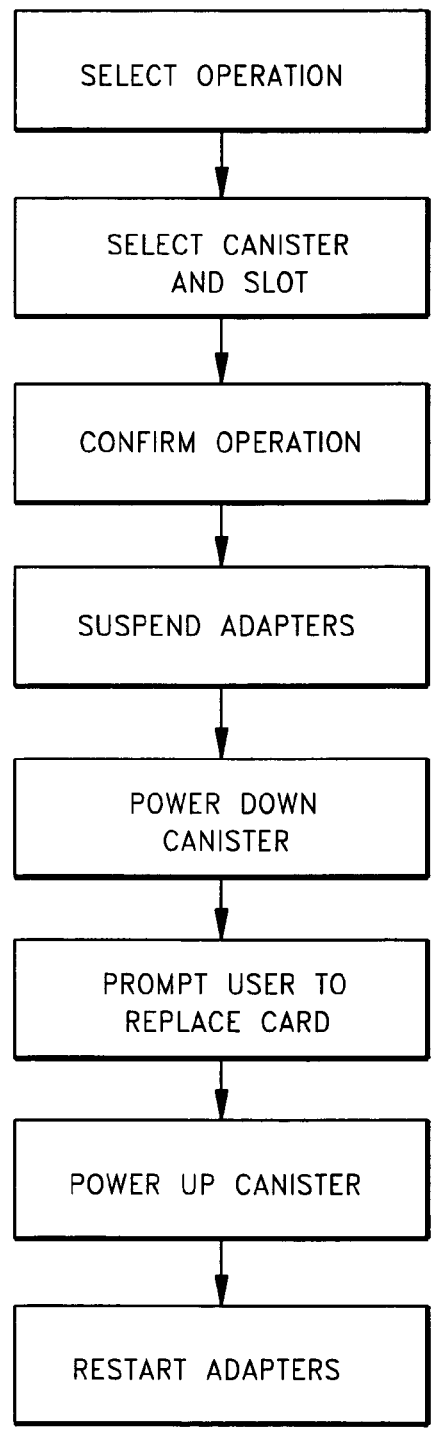
FIG. 10 is a flow diagram illustrating the steps of one embodiment of a hot add process for a server having peripheral device slot canisters (NF-9016) and running the NetWare® operating system.

FIGS. 9 and 10 show the hot add process steps for the NF-9008 (FIG. 9) and NF-9016 (FIG. 10) servers. The process steps are shown for the NetWare® environment, although the process may also be implemented in the Windows® NT environment as will be understood by one of ordinary skill in the art. The hot add process is very similar to the hot swap process, except that in a hot add process, a peripheral card is inserted in a server slot that previously did not hold a card.

Figure 20:
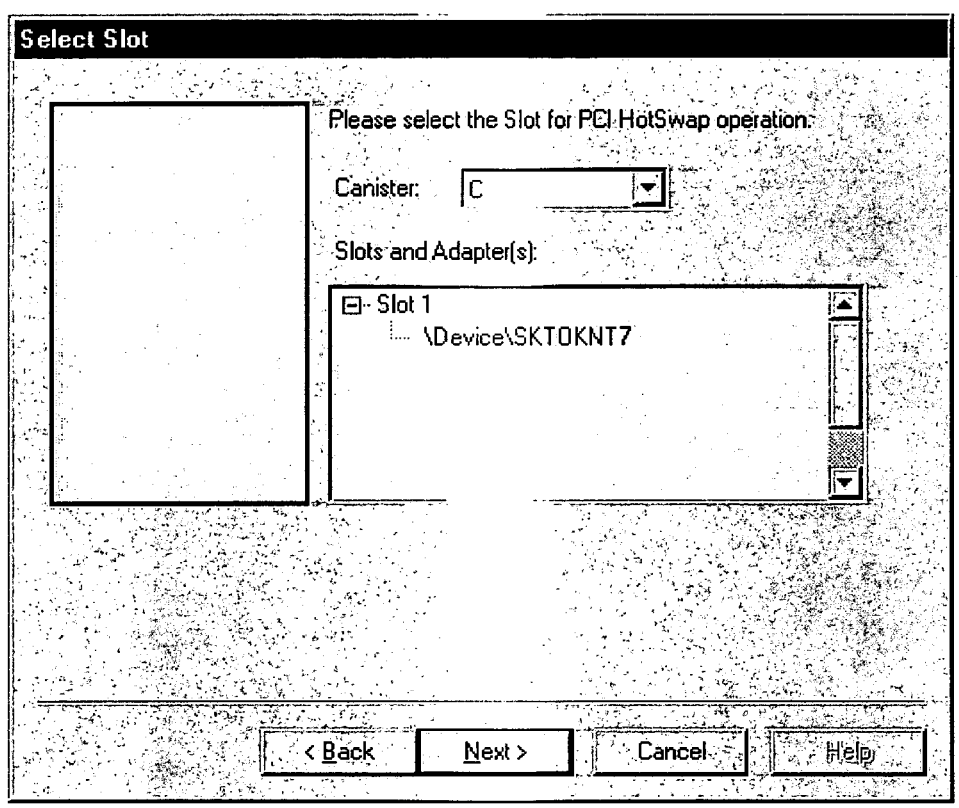
Figure 27:
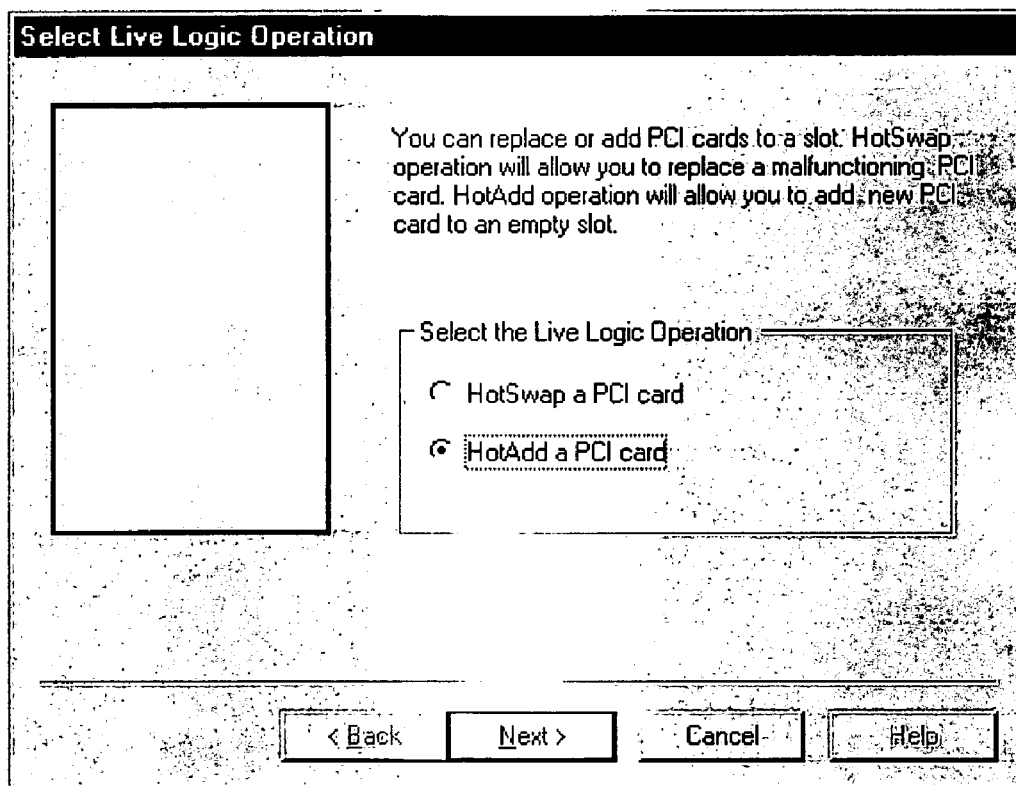
FIGS. 27 through 32 show the screen displays generated by one embodiment of the graphical user interface for a hot add process implemented in the NF-9008 server environment running the NetWare® operating system.
Figure 28:
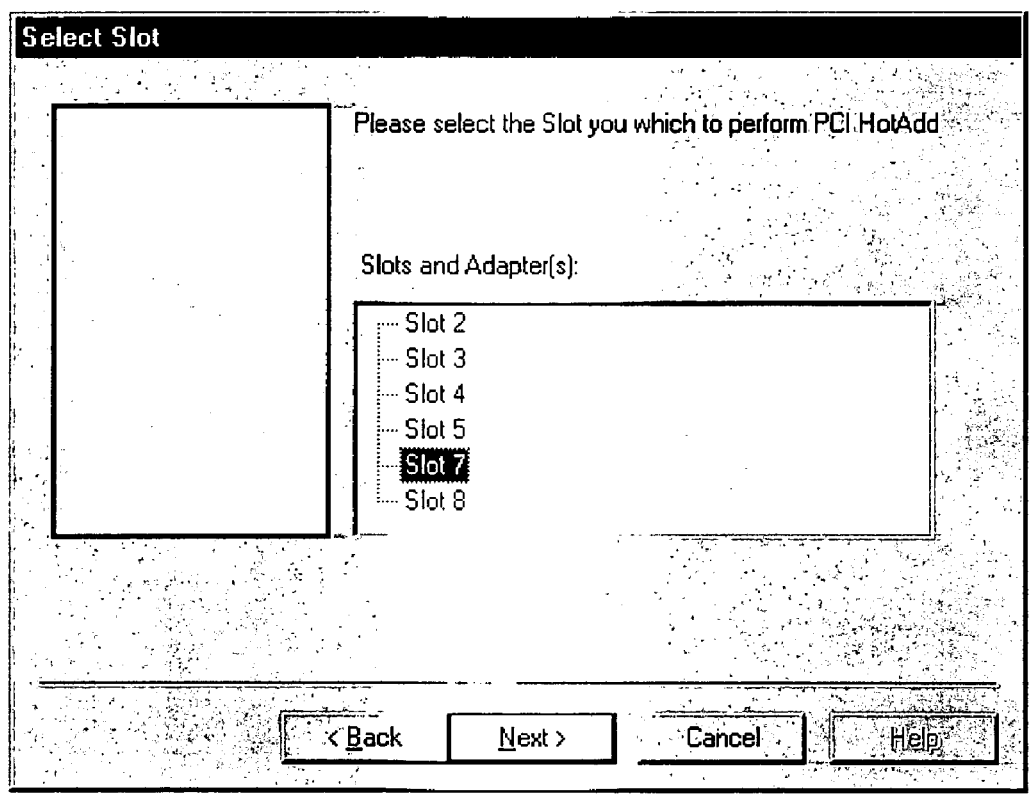
Figure 29:
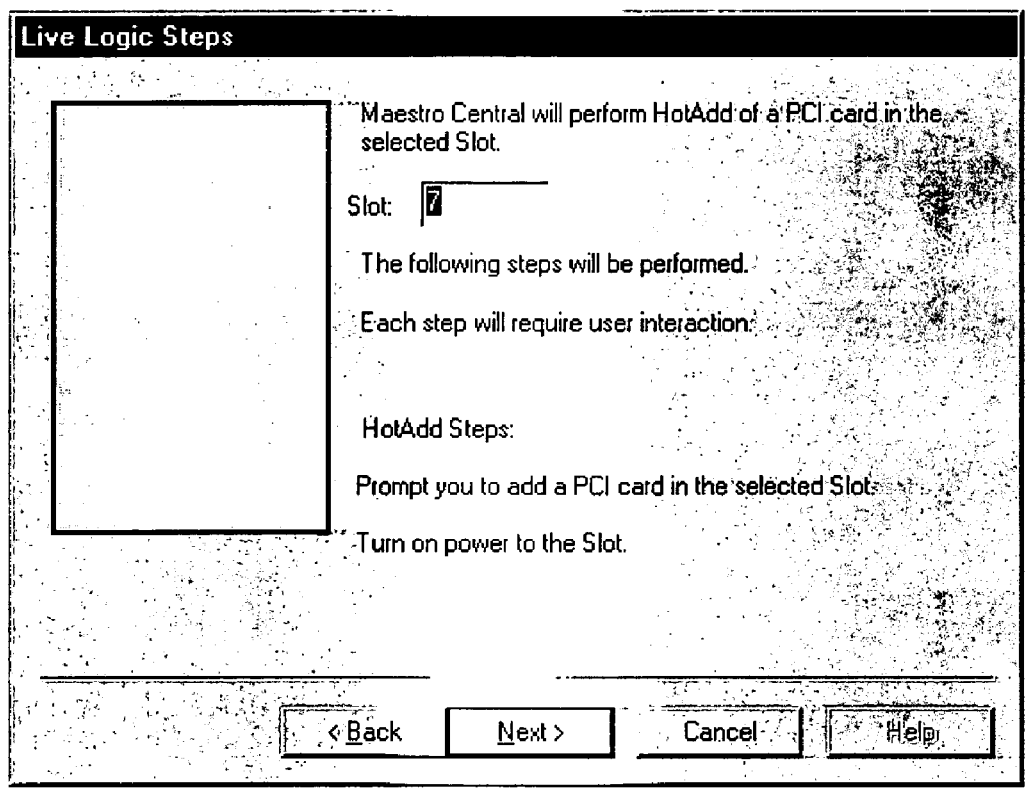
Figure 30:
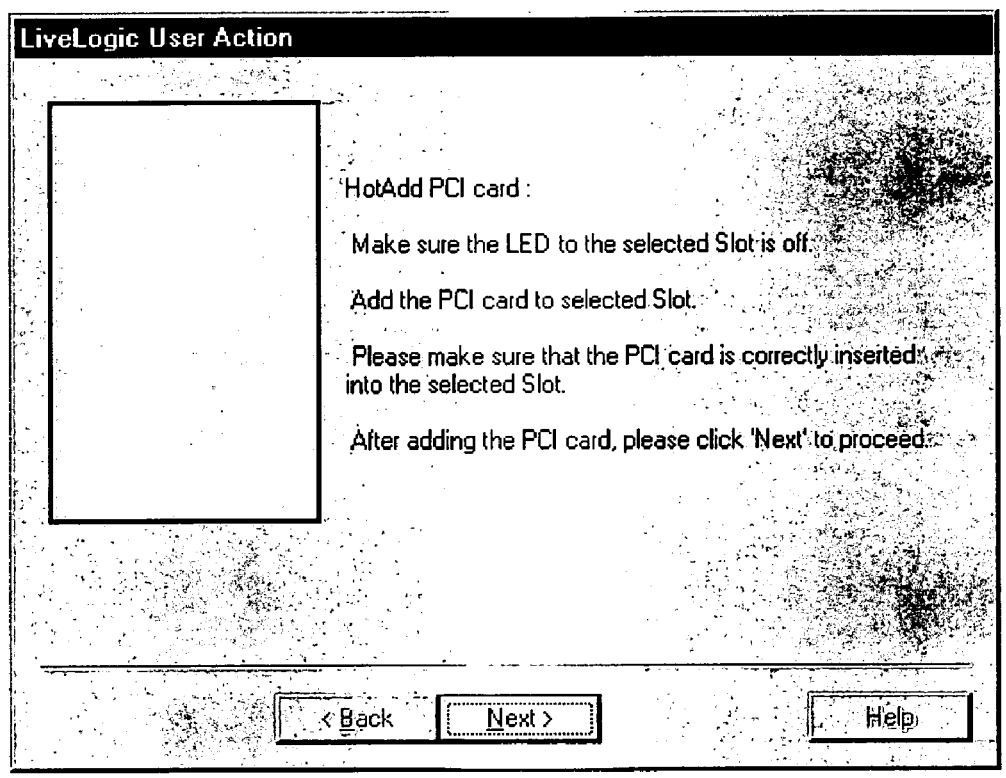
Figure 31:
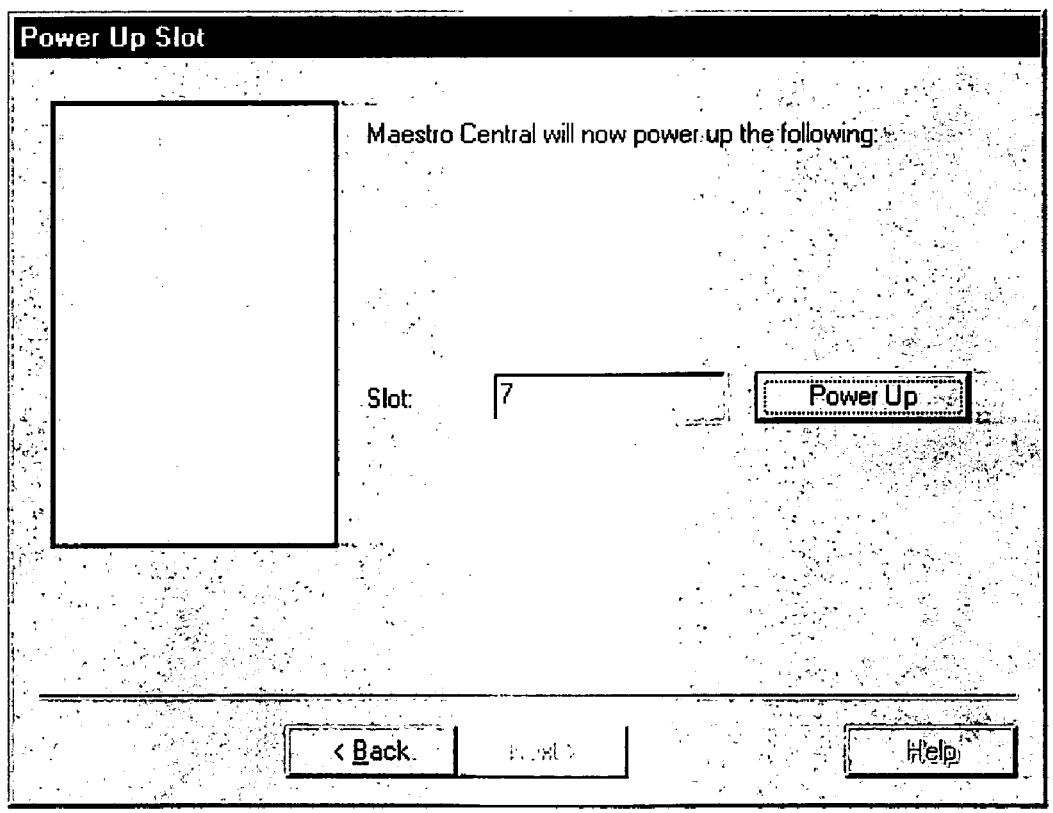
Figure 32:
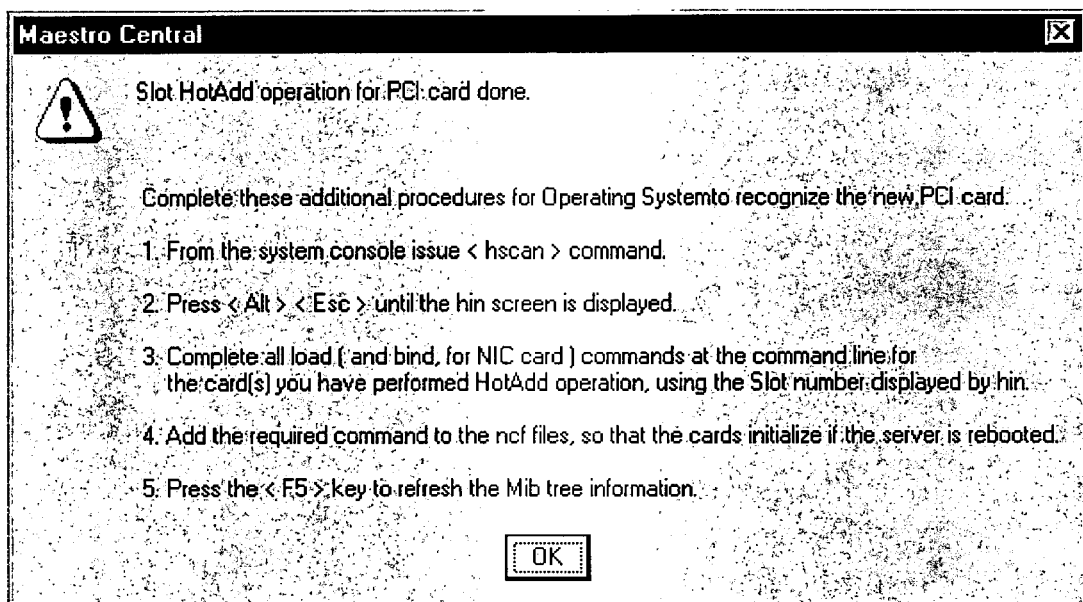

The screen displays for the hot add process for a NF-9008 server are shown in FIGS. 27 through 32. FIG. 27 shows that the first step in the hot add process is the same screen display as for the hot swap process, except that this time the user selects "Hot Add a PCI card." When the user selects the hot add option, the Custom GUI Module verifies from the state of the server object that the server is a NF-9008, and then verifies from the adapter and/or slot modules 60 that there is no peripheral card presently in that particular server slot. Once confirmation is received by the Custom GUI Module, in the next step, from the screen display shown in FIG. 28 the user selects the particular slot in which the peripheral card will be added, in a manner similar to the identical step in the hot swap process for the NF-9008 server, described above. The next screen display, shown in FIG. 29, is simply a confirmation screen, similar to FIG. 13 for the hot swap process, which just allows the user to hit the "Next" button to prompt the next screen. The next step in the hot add process is for the user to go to the server and physically insert the new peripheral card in the slot at the server. The screen display for this step is shown in FIG. 20. After hitting the "Next" button on the screen display, the user is prompted at the next screen display, shown in FIG. 31, to hit "Power Up" when ready to power the server slot up with the newly inserted peripheral card. At this step, the Custom GUI Module 54 accesses the appropriate slot module 60 to send a PowerUp command via the MIB Manager Module 48, the SNMP Module 50, and the network to the physical server slot, where the command operates to power up the previously inactive slot with the added adapter. Finally, the last user screen in the hot add process instructs the user to make sure to configure the new peripheral card for use. These steps to configure the new card are listed as shown in FIG. 31, and the configuration process for newly added peripheral cards is readily understood by those of ordinary skill in the art.

For the NF-9016 hot add operation, because the NF-9016 contains its peripheral card slots within canisters, the entire canister must be powered down and then back up in order to add a new card to one of the slots within a canister. For this reason the hot add process for the NF-9016 is nearly identical to the hot swap process for the NF-9016. The process steps in the hot add process are the identical steps implemented in the hot swap process (see FIGS. 8 and 19–26); the only difference is that when the user goes out to the peripheral card slot, the user only has to insert the new peripheral card rather than first removing an already resident card.

Thus, with respect to each of hot swap and hot add processes herein described and carried out by Maestro 14, the user is able to successfully complete a hot swap or a hot add of an adapter from the user's computer workstation screen, and is able to do so knowing no information about these processes other than which process is needed, and which particular server peripheral device slot is concerned.

APPENDIX A

Incorporation by Reference of Commonly Owned Applications
The following patent applications, commonly owned and filed Oct. 1, 1997, are hereby incorporated herein in their entirety by reference thereto:

| Title | application Ser. No. |
|---|---|
| "System Architecture for Remote Access and Control of Environmental Management" | 08/942,160 |
| "Method of Remote Access and Control of Environmental Management" | 08/942,215 |
| "System for Independent Powering of Diagnostic Processes on a Computer System" | 08/942,410 |
| "Method of Independent Powering of Diagnostic Processes on a Computer System" | 08/942,320 |
| "Diagnostic and Managing Distributed Processor System" | 08/942,402 |
| "Method for Managing a Distributed Processor System" | 08/942,448 |
| "System for Mapping Environmental Resources to Memory for Program Access" | 08/942,222 |
| "Method for Mapping Environmental Resources to Memory for Program Access" | 08/942,214 |
| "Hot Add of Devices Software Architecture" | 08/942,309 |
| "Method for The Hot Add of Devices" | 08/942,306 |
| "Hot Swap of Devices Software Architecture" | 08/942,311 |
| "Method for The Hot Swap of Devices" | 08/942,457 |
| "Method for the Hot Add of a Network Adapter on a System Including a Dynamically Loaded Adapter Driver" | 08/943,072 |
| "Method for the Hot Add of a Mass Storage Adapter on a System Including a Statically Loaded Adapter Driver" | 08/942,069 |
| "Method for the Hot Add of a Network Adapter on a System Including a Statically Loaded Adapter Driver" | 08/942,465 |
| "Method for the Hot Add of a Mass Storage Adapter on a System Including a Dynamically Loaded Adapter Driver" | 08/962,963 |
| "Method for the Hot Swap of a Network Adapter on a System Including a Dynamically Loaded Adapter Driver" | 08/943,078 |
| "Method for the Hot Swap of a Mass Storage Adapter on a System Including a Statically Loaded Adapter Driver" | 08/942,336 |
| "Method for the Hot Swap of a Network Adapter on a System Including a Statically Loaded Adapter Driver" | 08/942,459 |
| "Method for the Hot Swap of a Mass Storage Adapter on a System Including a Dynamically Loaded Adapter Driver" | 08/942,458 |
| "Method of Performing an Extensive Diagnostic Test in Conjunction with a BIOS Test Routine" | 08/942,463 |
| "Apparatus for Performing an Extensive Diagnostic Test in Conjunction with a BIOS Test Routine" | 08/942,163 |
| "Configuration Management Method for Hot Adding and Hot Replacing Devices" | 08/941,268 |
| "Configuration Management System for Hot Adding and Hot Replacing Devices" | 08/942,408 |
| "Apparatus for Interfacing Buses" | 08/942,382 |
| "Method for Interfacing Buses" | 08/942,413 |
| "Computer Fan Speed Control Device" | 08/942,447 |
| "Computer Fan Speed Control Method" | 08/942,216 |
| "System for Powering Up and Powering Down a Server" | 08/943,076 |
| "Method of Powering Up and Powering Down a Server" | 08/943,077 |
| "System for Resetting a Server" | 08/942,333 |
| "Method of Resetting a Server" | 08/942,405 |
| "System for Displaying Flight Recorder" | 08/942,070 |
| "Method of Displaying Flight Recorder" | 08/942,068 |

APPENDIX A-continued

Incorporation by Reference of Commonly Owned Applications
The following patent applications, commonly owned and filed Oct. 1, 1997, are hereby incorporated herein in their entirety by reference thereto:

| Title | application Ser. No. |
|---|---|
| "Synchronous Communication Interface" | 08/943,355 |
| "Synchronous Communication Emulation" | 08/942,004 |
| "Method for Facilitating the Replacement or Insertion of Devices in a Computer System" | 08/942,316 |
| "System Management Graphical User Interface" | 08/943,357 |
| "Display of System Information" | 08/942,195 |
| "Data Management System Supporting Hot Plug Operations on a Computer" | 08/942,129 |
| "Data Management Method Supporting Hot Plug Operations on a Computer" | 08/942,124 |
| "Alert Configurator and Manager" | 08/942,005 |
| "Managing Computer System Alerts" | 08/943,356 |
| "Computer Fan Speed Control System" | 08/940,301 |
| "Computer Fan Speed Control System Method" | 08/941,267 |
| "Black Box Recorder for Information System Events" | 08/942,381 |
| "Method of Recording Information System Events" | 08/942,164 |
| "Method for Automatically Reporting a System Failure in a Server" | 08/942,168 |
| "System for Automatically Reporting a System Failure in a Server" | 08/942,384 |
| "Expansion of PCI Bus Loading Capacity" | 08/942,404 |
| "Method for Expanding PCI Bus Loading Capacity" | 08/942,223 |
| "System for Displaying System Status" | 08/942,347 |
| "Method of Displaying System Status" | 08/942,071 |
| "Fault Tolerant Computer System" | 08/942,194 |
| "Method for Hot Swapping of Network Components" | 08/943,044 |
| "A Method for Communicating a Software Generated Pulse Waveform Between Two Servers in a Network" | 08/942,221 |
| "A System for Communicating a Software Generated Pulse Waveform Between Two Servers in a Network" | 08/942,409 |
| "Method for Clustering Software Applications" | 08/942,318 |
| "System for Clustering Software Applications" | 08/942,411 |
| "Method for Automatically Configuring a Server after Hot Add of a Device" | 08/942,319 |
| "System for Automatically Configuring a Server after Hot Add of a Device" | 08/942,331 |
| "Method of Automatically Configuring and Formatting a Computer System and Installing Software" | 08/942,412 |
| "System for Automatically Configuring and Formatting a Computer System and Installing Software" | 08/941,955 |
| "Determining Slot Numbers in a Computer" | 08/942,462 |
| "System for Detecting Errors in a Network" | 08/942,169 |
| "Method of Detecting Errors in a Network" | 08/940,302 |
| "System for Detecting Network Errors" | 08/942,407 |
| "Method of Detecting Network Errors" | 08/942,573 |

What is claimed is:

1. An electronic device, comprising:
   one or more slots configured to receive at least one peripheral adapter;
   a software module configured to provide a graphical user interface that indicates whether a selected operational slot in the electronic device is configured to support a hot input function; and
   one or more hardware modules in the electronic device configured to control the power to the selected operational slot.

2. The system of claim 1, wherein the electronic device is configured to suspend and resume communication to and from the selected operational slot in response to a user request to perform the hot insert function.

3. The system of claim 1, wherein the electronic device includes a component for enabling and disabling power to the selected operational slot.

4. A system allowing replacement or insertion of an adapter in an electronic device, comprising:
   an electronic device;
   a user interface module; and
   at least one module configured to communicate with the user interface module and inform the user interface module as to whether a selected operational adapter location in the electronic device is configured to support a hot input function, the module additionally configured to transmit instructions regarding the hot insert of an adapter in the electronic device.

5. The system as defined in claim 4, wherein the user interface module comprises a graphical user interface.

6. The system as defined in claim 4, wherein the user interface module comprises a series of screen displays exhibiting the steps to hot insert the adapter in the electronic device.

7. The system as defined in claim 4, wherein one of the transmitted instructions is for the electronic device to isolate the selected operational adapter location.

8. The system as defined in claim 7, wherein one of the instructions is for the electronic device to suspend or restart a peripheral adapter.

9. The system as defined in claim 7, wherein one of the instructions is for the electronic device to suspend or restart power to the operational adapter location in the electronic device.

10. The system as defined in claim 7, wherein one of the instructions is for the electronic device to initialize an adapter.

11. A system allowing replacement or insertion of an adapter in an electronic device, comprising:
    an electronic device;
    means for providing a graphical user interface;
    means for hot inserting an adapter in the electronic device;
    the graphical user interface including means for displaying the steps to hot insert an adapter; and
    means in communication with the graphical user interface communicating information as to whether a selected functioning adapter location is configured to support a hot insert function and for hot inserting an adapter.

12. The system as defined in claim 11, wherein the means in communication with the graphical user interface for hot inserting an adapter comprises a plurality of software object modules.

13. An electronic device for hot inserting an adapter, the electronic device comprising:
    an electronic device and one or more peripheral adapters;
    a configuration manager capable of freezing communications between the electronic device and the peripheral adapters;

a power management module capable of issuing commands to enable and disable the power to the peripheral adapters; and a graphical user interface delivering instructions to confirm that a particular functioning adapter location is configured to support a hot insert function.

14. The system as defined in claim 13, wherein the one or more peripheral adapters comprise I/O devices.

15. An electronic device comprising:
an electronic device; and
a graphical user interface configured to provide one or more screen displays for communicating information to a user as to whether an selected operational adapter location is configured to support a hot insert function and for displaying information regarding the steps for hot inserting an adapter.

16. The electronic device of claim 15, wherein the electronic device includes a device for disabling and enabling power to the selected operational adapter location.

17. The electronic device of claim 15, wherein the electronic device is configured to suspend and resume communication to and from the selected operational adapter location in response to a user request to perform the hot insert function.

18. A method comprising:
displaying on a display device a graphical user interface configured to provide one or more screen displays for communicating information to a user as to whether a selected operational adapter location is configured to support a hot insert function.

19. The method of claim 18, additionally comprising suspending and resuming communications to and from the selected operational adapter location in response to a user request to perform the hot insert function.

20. The method of claim 18, additionally comprising disabling and enabling power to the selected operational adapter location in response to a user request to perform the hot insert function.

21. A system allowing replacement or insertion of an adapter in an electronic device, the system comprising:
an electronic device having a plurality of adapter locations;
a user interface module in communication with the electronic device, the user interface module configured to indicate whether or not a selected functioning adapter location is configured to support a hot input function; and
at least one communication module in communication with the user interface module and the selected functioning adapter location, wherein the at least one communication module transmits information to the user interface module as to whether the selected functioning adapter location is configured to support the hot input function.

22. The system of claim 21, wherein the user interface module comprises a graphical user interface.

23. The system of claim 21, wherein the user interface module comprises a series of screen displays exhibiting steps to hot input an adapter.

24. The system of claim 21, wherein the hot input function comprises a hot add function.

25. The system of claim 21, wherein the hot input function comprises a hot swap function.

26. A system allowing replacement or insertion of an adapter in an electronic device, the system comprising:
an electronic device;
a user interface means for communicating with the electronic device; and
means for providing information via the user interface means as to whether a selected operational adapter location of the electronic device is configured to support a hot input function.

27. The system of claim 26, wherein the means for providing information comprises a plurality of software modules.

28. The system of claim 26, wherein the information is provided in graphical form.

29. The system of claim 26, wherein the information is provided in character-oriented form.

30. An electronic system for hot inserting an adapter, the system comprising:
an electronic device having at least one adapter;
a configuration manager capable of suspending communications between the electronic device and the at least one adapter;
a power management module capable of managing power to the at least one adapter; and
a user interface in communication with the configuration module to confirm that a particular functioning adapter location is configured to support a hot input function.

31. The electronic system of claim 30, wherein the at least one adapter comprises an input/output (I/O) device.

32. The electronic system of claim 30, wherein the hot input function comprises a hot swap function.

33. The electronic system of claim 30, wherein the hot input function comprises a hot add function.

34. An electronic device comprising a user interface having a first screen display providing a list of steps in a hot input function and having a second screen display providing information as to whether a selected operational adapter location is configured to support the hot input function.

35. A computer system for facilitating the replacement or insertion of an adapter, the computer system comprising:
a plurality of canisters, each canister having a plurality of slots, each slot configured to receive a peripheral adapter;
a user interface module configured to provide at least one screen display that indicates if a selected operational slot of the plurality of slots is configured to support a hot input function; and
a power module configured to disable and enable power to each slot of a selected one of the plurality of canisters having the selected operational slot in response to a user request to add another peripheral adapter to the selected operational slot.

36. The computer system of claim 35, wherein the at least one screen display comprises a plurality of windows.

37. The computer system of claim 35, further comprising a software module configured to suspend communication to and from each slot of the selected one of the plurality of canisters in response to the user request.

38. The computer system of claim 35, wherein at least one of the plurality of slots is configured to receive a peripheral card.

39. The computer system of claim 35, further comprising an operational computer in communication with the plurality of canisters.

* * * * *